(12) United States Patent
van Lierop et al.

(10) Patent No.: US 9,910,269 B2
(45) Date of Patent: Mar. 6, 2018

(54) MEMS SCANNING MICROMIRROR

(71) Applicant: Innoluce B.V., Nijmegen (NL)

(72) Inventors: Hendrikus Wilhelmus Leonardus Antonius Maria van Lierop, Nijmegen (NL); Matthijs Alexander Gerard Suijlen, Nijmegen (NL)

(73) Assignee: ELMOS SEMICONDUCTOR AKTIENGESELLSCHAFT, Dortmund (DE)

( * ) Notice: Subject to any disclaimer, the term of this patent is extended or adjusted under 35 U.S.C. 154(b) by 784 days.

(21) Appl. No.: 14/361,472

(22) PCT Filed: Nov. 28, 2012

(86) PCT No.: PCT/NL2012/050845
§ 371 (c)(1),
(2) Date: May 29, 2014

(87) PCT Pub. No.: WO2013/081458
PCT Pub. Date: Jun. 6, 2013

(65) Prior Publication Data
US 2014/0327946 A1    Nov. 6, 2014

(30) Foreign Application Priority Data
Nov. 29, 2011    (NL) ..................................... 2007886

(51) Int. Cl.
G02B 26/08    (2006.01)
G02B 26/10    (2006.01)
(Continued)

(52) U.S. Cl.
CPC .............. *G02B 26/10* (2013.01); *B81B 3/007* (2013.01); *B81C 1/00134* (2013.01);
(Continued)

(58) Field of Classification Search
CPC ................ G02B 5/3025; G02B 5/3033; G02B 26/0841; G02B 26/085; G02B 26/0858;
(Continued)

(56) References Cited

U.S. PATENT DOCUMENTS 6,647,164 B1 * 11/2003 Weaver ............... G02B 26/0866
359/224.1
2010/0290142 A1 * 11/2010 Krastev .............. G02B 26/0833
359/872

FOREIGN PATENT DOCUMENTS

EP         2100848        9/2009
WO    WO2008089786        7/2008

OTHER PUBLICATIONS

Nee, J.T. et al. "Lightweight optically flat micromirrors for fast beam steering" Optical Mems, 2000 IEEE/LEOS International Conference on Aug. 21, 2000, pp. 9-10.

* cited by examiner

Primary Examiner — Thomas K Pham
Assistant Examiner — Sharrief Broome
(74) Attorney, Agent, or Firm — Hoffmann & Baron, LLP

(57) ABSTRACT

A MEMS-micro-mirror (30) is provided comprising a mirror body (50) that is rotatably arranged in a mirror frame (60) around a rotation axis (58) extending in a plane defined by the mirror body. The rotation axis extends through a first and a second mutually opposite end-portion (51, 53) of the mirror body. The mirror has a reflective first main surface (55) and opposite said first main surface a second main surface (57) provided with a first and a second pair of reinforcement beams. The pair of reinforcement beams (91*a*, 91*b*) extends from the first end-portion (51) in mutually opposite directions away from the rotation axis. The second pair of reinforcement beams (93*a*, 93*b*) extends from the second end-portion (53) in mutually opposite directions
(Continued)

away from the rotation axis. Reinforcement beams of said first pair extend towards respective ones of said second pair.

17 Claims, 19 Drawing Sheets

(51) Int. Cl.
*G02B 26/12* (2006.01)
*B81B 3/00* (2006.01)
*B81C 1/00* (2006.01)

(52) U.S. Cl.
CPC ...... *B81C 1/00666* (2013.01); *G02B 26/0833* (2013.01); *G02B 26/0841* (2013.01); *B81B 2201/042* (2013.01); *B81B 2203/0109* (2013.01); *B81C 2201/0147* (2013.01)

(58) Field of Classification Search
CPC .............. G02B 26/0866; G02B 26/105; G02B 26/121; G02F 1/133528
USPC ......... 359/198.1–199.4, 200.6–200.8, 202.1, 359/221.2, 223.1–225.1, 226.2, 904, 359/290–295, 838, 846, 871, 872
See application file for complete search history.

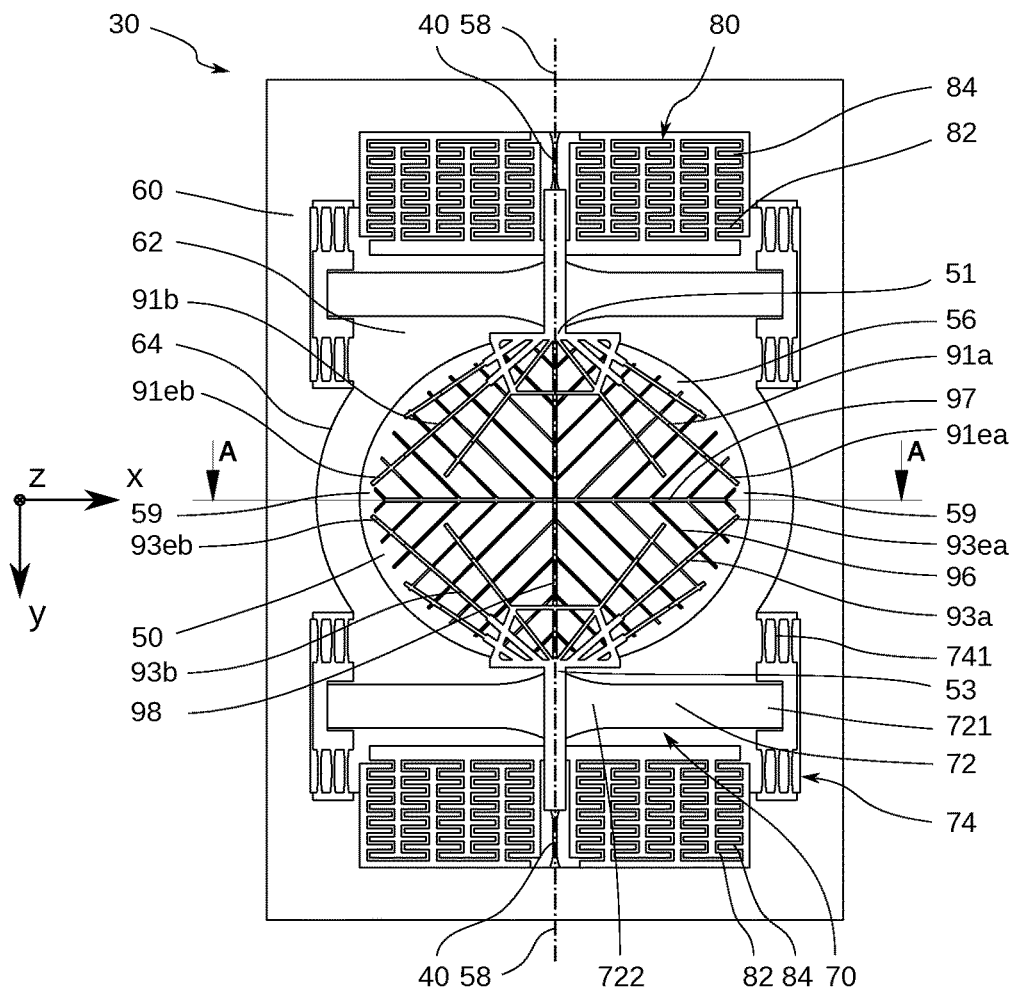
FIG. 5A
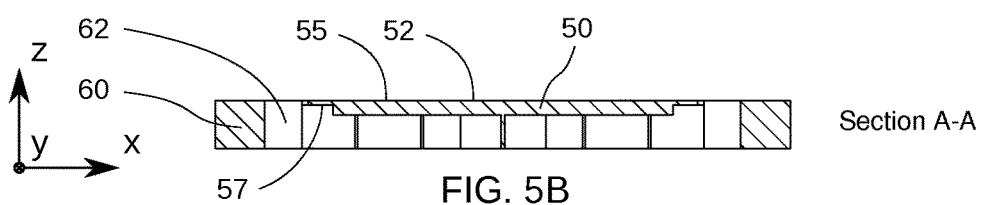
FIG. 5B  Section A-A
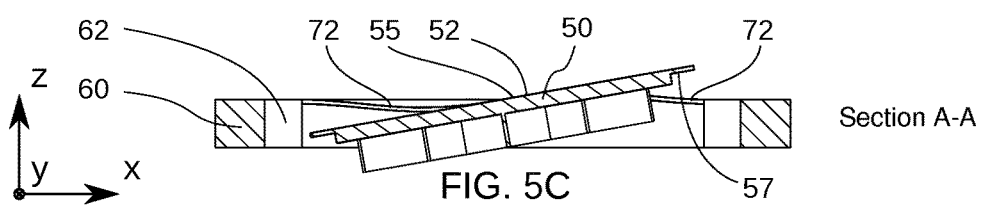
FIG. 5C  Section A-A Series A Series A Series B Series B Series B Series C Series C Series C

MEMS SCANNING MICROMIRROR

This application claims priority based on an International Application filed under the Patent Cooperation Treaty, PCT/NL2012/050845, filed on Nov. 28, 2012, and Netherlands Application No. NL2007886, filed on Nov. 29, 2011.

BACKGROUND

Field of the Invention

The technical field of this disclosure is Micro Electro Mechanical Systems (MEMS), particularly, MEMS scanning micromirrors.

Related Art

MEMS scanning micromirrors have been developed for the display of visual information. The MEMS scanning micromirror oscillates in one or two dimensions and a laser or other light beam reflects from the mirror surface. Varying the angle and timing of the beam incident on the mirror surface generates a visual image on a screen or other surface, such as a two dimensional display matrix. Different numbers of MEMS scanning micromirrors and lasers are used to produce images of different detail and colors. Exemplary uses for the MEMS scanning micromirrors are video projection (e.g. in head up displays for automotive applications or for pico-projection in mobile phones), optical coherence tomography, and laser Doppler vibrometry.

The first, most well-known category of MEMS scanning micromirrors of which an example is shown in FIG. 1 include a mirror 52 on a mirror body 50 attached to a mirror frame 60 by two collinear torsion beams 41, which create a scanning axis 58 about which the mirror body 50 rotates. The torsion beams 41 both support the mirror body 50 and provide the required torsional stiffness during rotation. The torsion beams 41 are the only points of attachment between the mirror body 50 and the mirror frame 60, and determine the resonant frequency of the MEMS scanning micromirror 30. If this category of mirrors is to be driven resonantly at a very high natural frequency, then the rotational stiffness of the torsion beams 41 should be as high as possible, whereas the rotational inertia of the mirror body 50 should be as low as possible. Increasing the rotational stiffness is difficult because it will also increase the mechanical stresses and increase the risk of failure, unless the tilting angle is reduced. Reducing the inertia of the mirror body 50 can be achieved by reducing the thickness of the mirror, but this will inevitably increase both the static and dynamic deformation of the mirror 50. This will again reduce the optical quality.

Problems with image quality in the present generation of MEMS scanning micromirrors arise due to both static and dynamic mirror deformation. This deformation should not be higher than ±λ/10, where λ is the shortest laser wavelength used in the scanning application. Dynamic deformation is caused by acceleration forces, which are high because of the required optical performance. One of the parameters is the image resolution, which should be high to get a good image quality or to enable large displays. For a perfectly flat mirror, the image resolution is proportional to the product of scanning angle and micromirror diameter. When the image resolution is to be increased then a larger scanning angle or a larger mirror diameter is required, or both. Commonly, also a higher frequency is desired. Larger scanning angles, larger mirror diameters, and higher frequencies all lead to higher acceleration forces. These acceleration forces act on the complete mirror body, but are most prevalent at the largest distance from the rotation axis, which is at the rim of the mirror body. These acceleration forces will dynamically deform the mirror body.

The torque exerted by the torsion-beams, or by any other springs attached to the mirror body such as cantilever beams, leads to the resonant oscillation of the mirror body. This torque also leads to the aforementioned acceleration forces, which are most prevalent at the rim of the mirror. Therefore the torque must be transferred from the attachment point of the torsion-beams or cantilever beams to the tips of the mirror. In between the attachment points and the tips a bending moment will result, which will deform the mirror body, and which will lead to a dynamic deformation of the mirror and the mirror body. Typical deformation patterns in the micromirror surface are S-shaped in cross-sections perpendicular to the micromirror's rotation axis and are arc- or saddle-like parallel to the rotation axis with opposite direction in cross-sections on both sides of the rotation axis. In cross-sections parallel to the rotation axis, the largest deviation from linearity due to deformation appears between their endpoints and midpoints and it is greatest at the micromirror sides parallel to the rotation axis.

Static deformation can be caused by intrinsic mechanical stresses of the mirror or mirror body, for example due to stresses induced by deposition of reflective layers, by processing or removing layers, by temperature gradients or by differences in thermal expansion coefficient of different materials. The static deformation can be reduced by either reducing the stress level or by increasing the stiffness of the mirror body, making it more resilient against the mechanical stress. Increasing the stiffness however requires adding material (and therefore adding mass) or moving material to different locations, both of which will affect the moment of inertia and the resonance frequency.

One approach to reduce both the dynamic and static deformation of the micromirror has been to make the mirror plate thicker to better resist bending moments. Unfortunately, the greater micromirror mass and greater mass moment of inertia requires higher suspension stiffness to maintain a certain resonance frequency, which leads to increased stress in the torsion beams, cantilever beams, and relief springs. Stress in these elements is a limiting factor in achieving higher oscillation frequencies, higher scanning resolution and tilting angle, and longer lifetime and higher reliability. The extra mass in the in the system also reduces the out-of-plain mode resonance frequencies of the micromirror and makes the MEMS mirror more vulnerable to parasitic oscillations due to imperfections and external disturbances, which reduces the performance and image quality as well. Therefore, the increased thickness and mass moment of inertia further limits the achievable image quality.

Another approach to reduce micromirror dynamic deformation has been to increase thickness, and combining this with a removal of material from the back of the mirror body 20 beneath the mirror to reduce mass. FIG. 2 is a bottom perspective view of a mirror body with a mirror frame having a pattern of diamond-shapes. The mirror body 20 with a rotation axis 22 forms diamond shaped stiffeners 26 perpendicular to the rotation axis 22 through the removal of triangular cutouts 28. The diamond shaped stiffeners 26 act as a straight beam transverse to the rotation axis 22, with the most mass near the rotation axis 22 for stiffness and the least mass away from the rotation axis 22 to reduce the mass moment of inertia. The width of the last diamond shaped stiffener 26 is large near the rotation axis 22 defined by the torsion beam 29 since the operating stress is high in this area.

Another system of material removal forms a uniform honeycomb shaped pattern across the back of the mirror plate. While the diamond and honeycomb shaped patterns reduce the mass moment of inertia and therewith also the forces acting on the mirror body 20, they reduce the torsional stiffness of the mirror body 20 along the rotation axis 22 as well, which leads to insufficient reduction of the micromirror dynamic deformation. They fail to optimally couple the points of the micromirror subject to the most deformation with the points where the torque is introduced. It is also noted that the mass moment of inertia is not reduced very strongly for the first eigenmode. It is reduced even less strongly for the higher order eigenmodes, such as translation perpendicular to the mirror surface or rotation perpendicular to the rotation axis, than it has been for the oscillation around the rotation axis.

NEE J T ET AL: "Lightweight, optically flat micromirrors for fast beam steering", OPTICAL MEMS, 2000 IEEE/LEOS INTERNATIONAL CONFERENCE ON 21-24 Aug. 2000, PISCATAWAY, N.J., USA, IEEE, 2000-08-21, pp. 9-10, ISBN: 978-0-7803-6257-4 relates to a tensile-optical-surface (TOS) micromirror, consisting of a tensile polysilicon membrane stretched across a stiff, single-crystal silicon-rib structure that is suspended by torsion-hinges. The torsion-hinges allow the mirror to rotate along a single axis defined by these hinges. It is considered therein that the combined advantages of lightweight, stiff micromirrors provided by TOS (as compared to slab type micro-mirrors) and the high-force actuation of STEC enable large-angle, low-voltage beam steering.

It is noted that EP 2 100 848 discloses a different type of micro-mirror having a mirror plate that is tiltable according to several axes. To that end the mirror plate is suspended with a pair of horizontal springs in a stiffening frame that on its turn is coupled to the main frame with a vertical spring. Each horizontal spring is provided with a pair of spring arms which form a fork. The spring arms are coupled to a respective coupling element mounted at the mirror plate at mutually opposite sides of the rotation axis defined by the horizontal springs.

SUMMARY OF THE INVENTION

It is an object of the present invention to provide a MEMS scanning micromirror with reduced static and dynamic deformation wherein the above disadvantages are at least mitigated.

According to the invention a MEMS-micro-mirror is provided comprising a mirror body that is rotatably arranged in a mirror frame around a rotation axis extending in a plane defined by the mirror body. The rotation axis extends through a first and a second mutually opposite end-portion of the mirror body, the mirror having a reflective first main surface and opposite said first main surface a second main surface provided with a first pair of reinforcement beams extending from the first end-portion in mutually opposite directions away from the rotation axis, a second pair of reinforcement beams extending from the second end-portion in mutually opposite directions away from the rotation axis, reinforcement beams of said first pair extending towards respective ones of said second pair. The reinforcement beams leave free an outer rim of the mirrorbody. In the MEMS-micro-mirror according to the invention, the reinforcement beams provide for a distribution of the torque applied to end-portions of the mirror to the circumference of the mirror body, therewith mitigating deformations of the mirror. The beams need only have a relatively small mass in comparison to the mirror body, so that their effect on the mass moment of inertia is modest.

BRIEF DESCRIPTION OF THE DRAWINGS

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

FIG. 3C is a cross section view as in FIG. 3B, but with a tilted mirror body;

FIG. 3D is a perspective view of said first embodiment;

FIG. 5A through 5I show a third embodiment of a MEMS scanning micromirror in accordance with the present invention, therein FIG. 5A, 5B respectively show a bottom and a cross section view of said third embodiment;

FIG. 5C is a cross section view as in FIG. 5B, but with a tilted mirror body;

FIG. 5D is a perspective view of said third embodiment;

FIG. 5E corresponds to FIG. 5A, but indicates various cross-sections,

FIG. 5F is a cross section according to D-D in FIG. 5E,

FIG. 5G is a cross section according to E-E in FIG. 5E,

FIG. 5H is a cross section according to F-F in FIG. 5E,

FIG. 5I is a cross section according to G-G in FIG. 5E,

DETAILED DESCRIPTION OF THE PRESENT INVENTION

Figure 1:
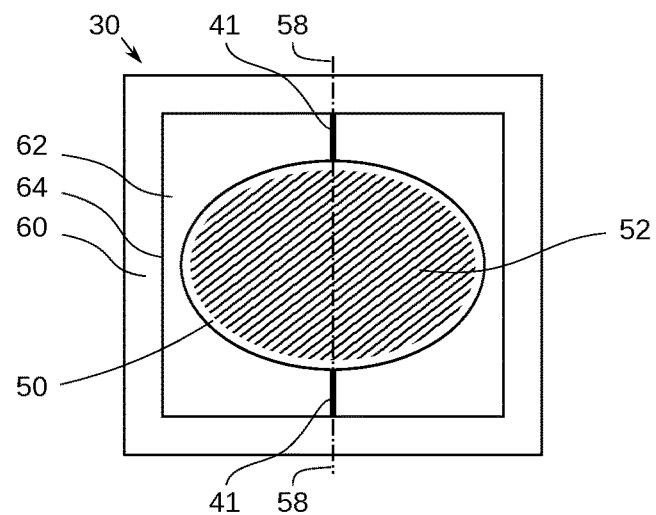
FIG. 1 provides a schematic illustration of a known MEMS scanning micromirror.
Figure 2:
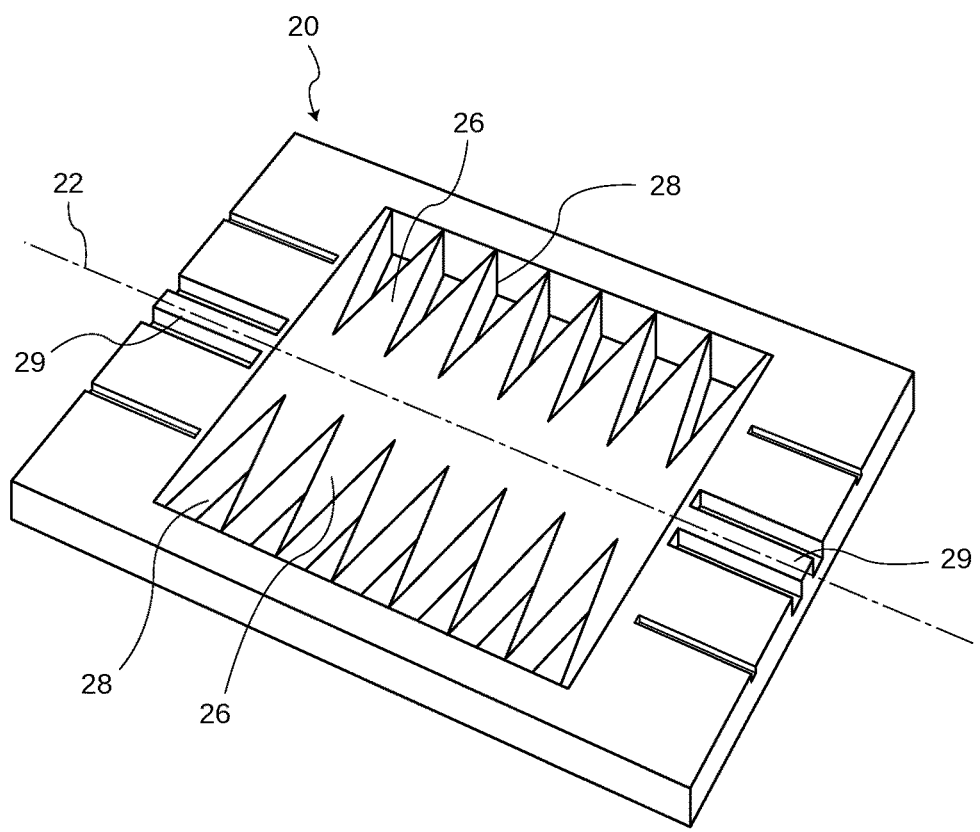
FIG. 2 is a bottom perspective view of a mirror plate with a diamond frame pattern of another known MEMS scanning micromirror.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

FIGS. 3A-3D, in which like elements share like reference numbers, are bottom, cross-sectional, and perspective views, respectively, of a MEMS scanning micromirror 30 in accordance with the present invention.

Figure 3A:
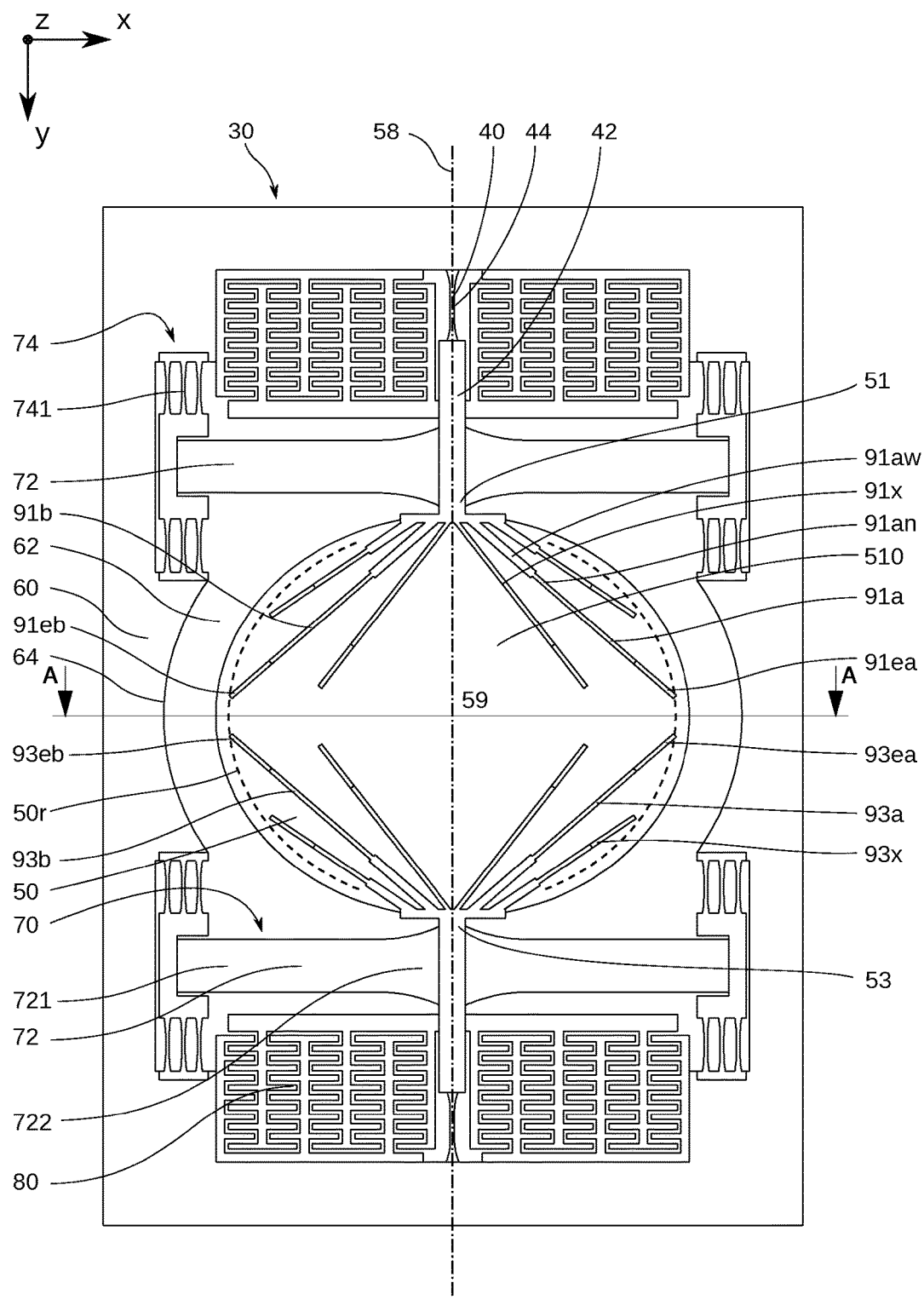
FIGS. 3A, 3B, 3C and 3D show a first embodiment of a MEMS scanning micromirror in accordance with the present invention, therein FIGS. 3A and 3B respectively show a bottom and cross section view of said first embodiment.

FIG. 3A shows a MEMS-micro-mirror 30 comprising a mirror body 50 that is rotatably arranged in a mirror frame 60 around a rotation axis 58. Here, the mirror body 50 is disposed within a mirror recess 62 of the mirror frame 60. The mirror frame 60 forms the mirror recess 62 with a recess periphery 64.

Figure 3B:
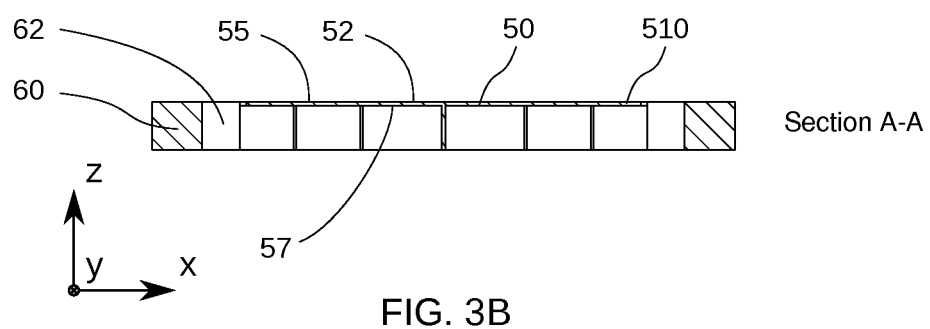
Figure 3C:
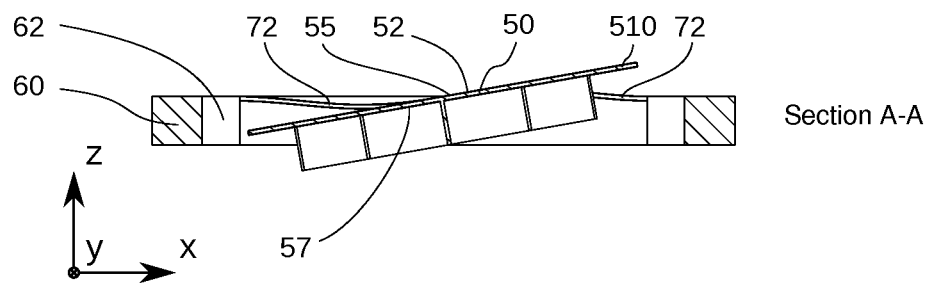
Figure 3D:
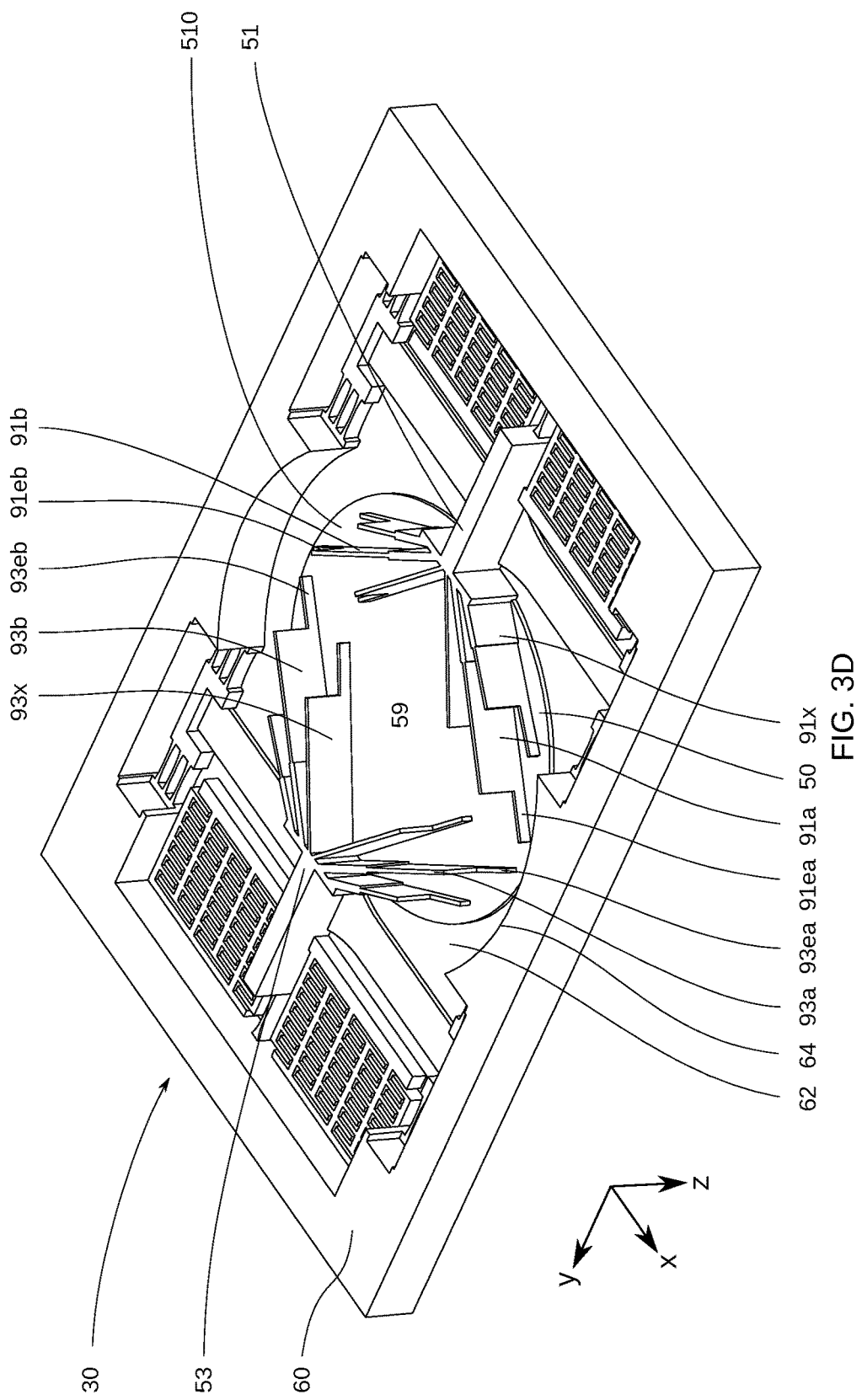

In FIG. 3B the mirror body 50 is shown in a rest position. FIG. 3B shows the micromirror according to a cross section along section A-A of FIG. 3A and FIG. 3C is a cross section along section A-A of FIG. 3A with the mirror body 50 tilted about the rotation axis 58. FIG. 3D is a perspective view of the micromirror in a rest position.

The rotation axis 58 extends in a plane defined by the mirror body 50 through a first and a second mutually opposite end-portion 51, 53 of the mirror body. The mirror has a reflective first main surface 55 (See FIG. 3B, 3C). Opposite said first main surface 55 the mirror has a second main surface 57. The second main surface 57 is provided with a first pair of reinforcement beams 91a, 91b extending from the first end-portion 51 in mutually opposite directions away from the rotation axis 58. The second main surface 57 is further provided with a second pair of reinforcement beams 93a, 93b extending from the second end-portion 53 in mutually opposite directions away from the rotation axis 58. The reinforcement beams 91a and 93a extend towards each other. Likewise the reinforcement beams 91b and 93b extend towards each other.

The reinforcement beams 91a, 91b, 93a, 93b provide for a distribution of the torque applied to end-portions of the mirror to the circumference of the mirror body, therewith mitigating deformations of the mirror. The beams need only take a relatively small portion of the surface area in comparison to the mirror body, so that their effect on the mass moment of inertia is modest.

A further reduction of the mass moment of inertia is obtained by the following additional measures.

In the embodiment shown, the reinforcement beams of the first pair 91a, 91b have ends 91ea, 91eb pointing away from the rotation axis that are disjunct from those 93ea, 93eb of the second pair 93a, 93b. Additionally, the reinforcement beams 91a, 91b, 93a, 93b leave free an outer rim 50r of the mirror (See FIG. 3A). The outer rim of the mirror is therefore not supported by the reinforcement beams, but the thickness of the mirror body itself is sufficient to prevent large dynamic or static deformations over a short distance.

Further, as shown in FIG. 3D, the reinforcement beams 91a, 91b, 93a, 93b extending from the end-portions have a height (as measured transverse to the XY plane) that decreases in a direction towards a periphery of the mirror body.

In this case the reduction in height is achieved by a single step, in that the reinforcement beam has a relatively high first portion close to the corresponding end of the mirror body, and a relatively low second portion remote from the corresponding end of the mirror body. In another embodiment the reinforcement beams have a continuously decreasing height towards their end 91ea, 91be, 93ea, 93be.

Alternatively, or in addition, as in the embodiment shown, the reinforcement beams extending from the end-portions have a width (as measured in the XY plane) that decreases in a direction towards a periphery of the mirror body. In the embodiment shown the reinforcement beams 91a, 91b, 93a, 93b have a first, relatively wide portion, close to the corresponding end of the mirror body, e.g. 91aw, and a second relatively narrow portion 91an (See FIG. 3A). In another embodiment the reinforcement beams have a continuously decreasing width towards their end 91ea, 91be, 93ea, 93be. Whereas this reduces the mass moment of inertia of the reinforcement beams, it does not reduce the stiffness perpendicular to the mirror surface as strongly. Therefore the stiffness is still high enough to suppress the static and dynamic deformation of the mirror.

In the embodiment shown, additional reinforcement beams 91x, 93x extending from an end-portion 51, 53 are provided. In this case, each reinforcement beam 91a, 91b, 93a, 93b is arranged between additional reinforcement beams that extend in mutually opposite directions away from said reinforcement beam 91a, 91b, 93a, 93b.

In the embodiment shown the MEMS scanning micromirror 30 further comprises cantilever beam assemblies 70. The cantilever beam assemblies 70 have a cantilever beam 72, and a relief means 74 comprising one or more relief springs 741 that connect the cantilever beams 72 to the mirror frame 60. In the embodiment shown, the mirror body 50 has a reflective first main surface 55. In one embodiment, the reflective first main surface 55 is formed by a separate layer on the mirror body. In another embodiment, the reflective first main surface 55 is formed by the mirror body 50.

The mirror body 50 can be square, rectangular, circular, elliptical, or any other planar shape desired for a particular application. The reflective first main surface 55 defines a mirrorplane.

In the embodiment shown, the mirror body 50 has a width defined in a direction transverse to the rotation axis 58 that increases in a direction from the first end-portion 51 towards a centre 59 between the first and the second end-portion 51, 53 and that decreases in a direction from the centre 59 towards the second end-portion 53. This contributes to a low mass moment of inertia of the mirror body 50. By way of example the mirror body 50 may be diamond shaped, with its rotation axis through an opposing pair of its vertices. Alternatively the mirror body may have a polygonal shape. In the embodiment shown the mirror is shaped as an ellipse of 2.7×2.3 mm, having its shortest axis coinciding with the rotation axis.

In the embodiment shown, the MEMS-micromirror is rotatably suspended by a respective coaxial support beam 40 at each end-portion. The coaxial support beams have a rigid longitudinal portion 42 that mechanically couples the corresponding end-portion 51, 53 to a cantilever beam assembly 70.

As further shown for this embodiment, the rigid longitudinal portion 42 mechanically couples the corresponding end-portion 51, 53 to an actuator 80.

Both the cantilever beam assemblies 70 and the actuators 80 introduce a torque to the mirror body. The cantilever beam assemblies 70 are described now in more detail. An example of an actuator 80 is described with reference to FIG. 6A.

The MEMS scanning micromirror in the embodiment shown uses the cantilever beam assemblies 70 coupled to the mirror body 50 to set the torsional stiffness about the rotation axis 58. The pair of coaxial support beams 40 supports the mirror body 50 perpendicular to a main surface of the mirror frame 60 at the rotation axis 58. However, the coaxial support beams 40 have a negligible effect on the torsional stiffness, so that the natural frequency of the mirror body 50 is substantially determined by the cantilever beam assemblies 70. The natural frequency is substantially independent of the coaxial support beams 40. The natural frequency as defined herein is the undamped frequency of the mirror body 50 about its rotation axis 58. The coaxial support beams 40 define the out-of-plane rocking stiffness and out-of-plane translation stiffness for the corresponding dynamic modes and corresponding resonant frequencies. The torsional stiffness can be decoupled from the out-of-plane rocking stiffness and out-of-plane translation stiffness so that the out-of-plane rocking and out-of-plane translation frequencies can be set to desired values, e.g. values higher than the value for the resonant frequency for rotation about the rotation axis, without influencing the torsional mode stiffness and resonant frequency. As defined herein, the Y axis is along the rotation axis 58, the X axis is perpendicular the Y axis on the mirror plane when the mirror 52 is at rest, and the Z axis is perpendicular to and out of the mirror plane when the mirror 52 is at rest.

The cantilever beam assemblies 70 provide torsional stiffness to the micromirror body 50 about the rotation axis 58. The relief means 74 provide a compliant or flexible coupling from the cantilever beams 72 to the mirror frame 60. The relief means 74 have a relatively low stiffness longitudinal to the cantilever beams 72 (in X-direction in FIGS. 3A-3D), which allows one end of the cantilever beams 72 to move in their longitudinal direction when the mirror body 50 rotates around the rotation axis 58. The relief means 74 have a relatively high stiffness in the transverse directions (In Z- and Y-direction in FIGS. 3A-3D).

The natural frequency of the rotation of the mirror 52 around the rotation axis 58 is mainly defined by the inertia of the mirror body 50 and the stiffness of the cantilever beam assemblies 70, which is again defined by the bending stiffness of the cantilever beams 72 and by the torsional and translational stiffness of the relief means 74. The bending stiffness of the cantilever beams 72 is defined by the length, width, and most importantly the thickness of those cantilever beams 72.

The combined stiffness in X direction of the coaxial support beams 40 and the relief means 74 prevent the movement of the mirror body 50 perpendicular to the rotation axis 58 (in the X direction) during operation.

The coaxial support beams 40 are connected between mirror frame 60 and the mirror body 50 along the rotation axis 58 to support the micromirror body 50 in the mirror frame 60. In one embodiment, the coaxial support beams 40 have a portion 44 with a relatively narrow rectangular cross sections perpendicular to the rotation axis 58, with the long axis of the rectangle perpendicular to the face of the mirror 52 and the mirror body 50, and the short axis of the rectangle parallel to the face of the mirror 52. The torsional stiffness corresponding to a rotation of the MEMS scanning micromirror 30 around rotation axis 58 is provided by the cantilever beam assemblies 70. The coaxial support beams 40 are only required for support of the mirror body 50 and have a negligible effect on the torsional stiffness. The coaxial support beams 40 are sized so that the stiffness against perpendicular displacement (in Z-direction) of the mirror body 50 and against its rocking movement perpendicular to the rotation axis 58 (around the Y axis) is as high as possible.

One end 722 of the cantilever beams 72 is fixed to the mirror body 50, at a position close to the rotation axis, whereas the other end 721 is connected to the relief means 74, at a position further away from the rotation axis. When the mirror body is oscillating around its rotation axis at its natural frequency, then a large oscillating torque will be exerted on the mirror body by the cantilever beams. The reinforcement beams 91a, 91b, 93a, 93b extend from the end-portions of the mirror-body towards various points on the mirror at a larger distance from the rotation axis. The end-portions on their turn are mechanically coupled via the rigid longitudinal portion to the cantilever beams. Therewith the torque supplied by the cantilever beams and/or the actuator can be smoothly distributed across the mirror body and across the mirror. Therewith excessive dynamic deformation of the mirror is prevented. Nevertheless, the mass moment of inertia can be low as the mirror body is relatively thin, e.g. in the range of a few μm up to about 20 μm. The reinforcement beams have a larger thickness, e.g. at least 40 μm. As these beams are however sparsely arranged over the second main surface of the mirror body, they contribute only modestly to the mass moment of inertia. The resulting low moment of inertia renders it possible to tilt the mirror with a relatively high resonance frequency. In a practical embodiment, the mirror comprises a continuous layer 510 having a thickness (in Z direction in FIG. 3D) of 10 μm and a patterned layer forming the reinforcement beams having a larger thickness, e.g. in the range of 40 μm to 500 μm.

Those skilled in the art will appreciate that the mirror support with discrete reinforcement beams as described above can be used with cantilever beams or with torsion-beams as desired for a particular application.

A further reduction of the mass moment of inertia can be obtained in an embodiment wherein a layer of material forming the reinforcement beams 91a, 91b, 93a, 93b has a direction of lowest material stiffness aligned with the rotation axis 58. This implies that the reinforcement beams 91a, 91b, 93a, 93b are at least substantially aligned with the direction of the highest material stiffness. This will allow the smallest possible width of the reinforcement beams, which will lead to the smallest possible contribution to the total moment of inertia. In the embodiments shown the reinforcement beams are implemented in a single crystal silicon layer having a direction of higher material stiffness. The reinforcement beams have their longitudinal direction aligned with the direction of higher material stiffness. More in particular the reinforcement beams are implemented in a silicon layer having a <110> axis and the reinforcement beams have their longitudinal direction aligned with the <110> direction which in this case has the higher material stiffness. The layer may be formed as a silicon on insulator layer.

Figure 4A:
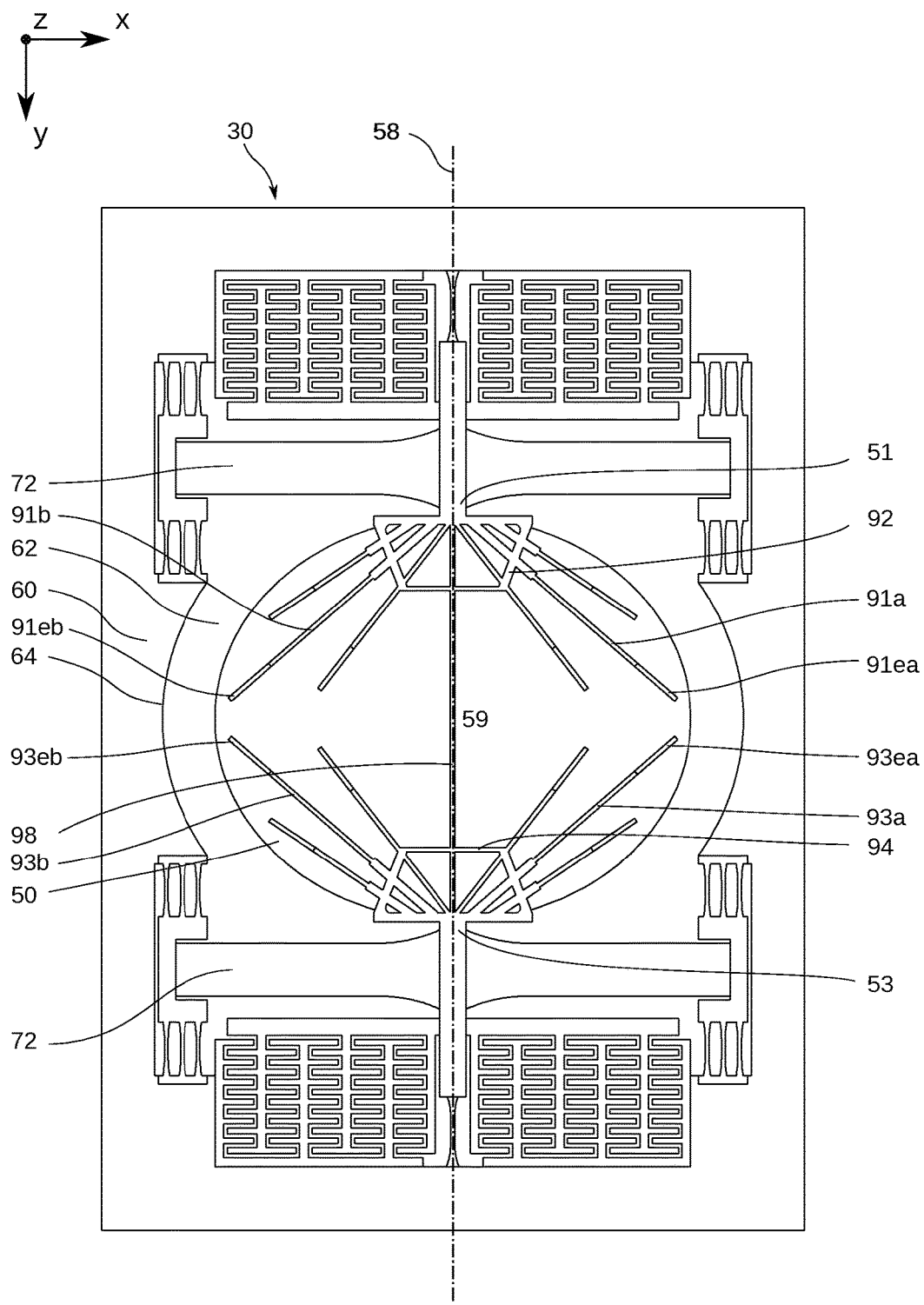
FIG. 4A, 4B: respectively show a bottom and cross section view of a second embodiment of a MEMS scanning micromirror in accordance with the present invention.
Figure 4B:
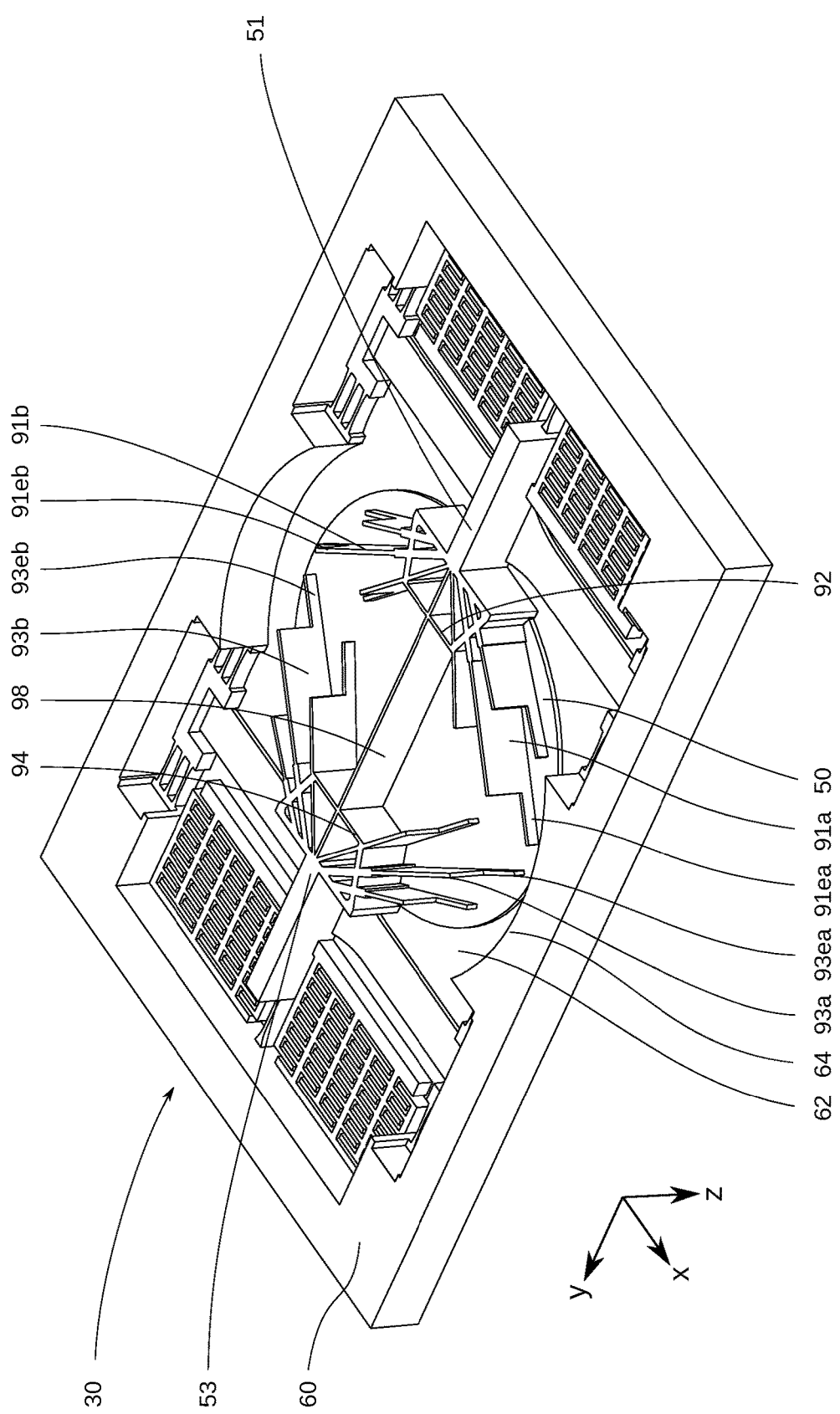

The rotation axis 58 can be oriented along different directions for different single crystal silicon wafers. When the single crystal silicon wafer is a (100) single crystal silicon wafer, the rotation axis 58 can be oriented along a <100> direction. When the single crystal silicon wafer is a (100) single crystal silicon wafer, the rotation axis 58 can be oriented along a <010> direction. When the single crystal silicon wafer is a (110) single crystal silicon wafer, the rotation axis 58 can be oriented along a <−110> direction. When the single crystal silicon wafer is a (110) single crystal silicon wafer, the rotation axis 58 can be oriented along a <001> direction In the embodiment shown in FIG. 4A, 4B the MEMS-micromirror comprises a respective reinforcement frame 92, 94 at each end portion 51, 53. Reinforcement frame 92 interconnects the reinforcement beams 91a, 91b of the first pair of beams as well as the additional beams in the end-portion 51. Likewise, reinforcement frame 94 interconnects the reinforcement beams 93a, 93b of the second pair of beams as well as the additional beams in the end-portion 53. The reinforcement frames aid in distributing the torque over the individual reinforcement beams, and levels the deformation from one reinforcement beam to another. Another reinforcement beam 98 has been added that extends along the rotation axis, and which helps to reduce the static deformation in that direction. For the same reason, optionally a reinforcement beam can be added that extends perpendicular to the rotation axis 58 and through the middle 59 of the mirror.

FIG. 5A to 5D show a further embodiment of the MEMS-micromirror of the present invention. Therein the second main surface is provided with further reinforcement beams 96 crossing the reinforcement beams 91a, 91b, 93a, 93b. The further reinforcement beams 96 are arranged transverse to the reinforcement beams 91a, 91b, 93a, 93b which they cross. I.e. the further reinforcement beams 96 cross the reinforcement beams 91a, 91b, 93a, 93b with an angle in the range of about 45 to 135 degrees. In the embodiment shown the further reinforcement beams 96 cross the reinforcement beams 91a, 91b, 93a, 93b substantially perpendicularly. In this way both the further reinforcement beams 96 and the reinforcement beams 91a, 91b, 93a, 93b are oriented along the direction of highest stiffness of the material used for constructing them. In another embodiment the further reinforcement beams 96 are formed as branches of the reinforcement beams 91a, 91b, 93a, 93b.

In the embodiment shown, the second main surface is partitioned in quadrants by the rotation axis and an axis transverse to the rotation axis and through a centre of the second main surface. Each quadrant comprises further reinforcement beams transverse to the reinforcement beams 91a, 91b, 93a, 93b that extend from the end-portion 51, 53 associated with said quadrant. In the sequel further the reinforcement beams 91a, 91b, 93a, 93b that extend from the end-portion 51, 53 will also be denoted as primary reinforcement beams and the further reinforcement beams transverse thereto or extending therefrom will also be denoted as secondary reinforcement beams.

Figure 5D:
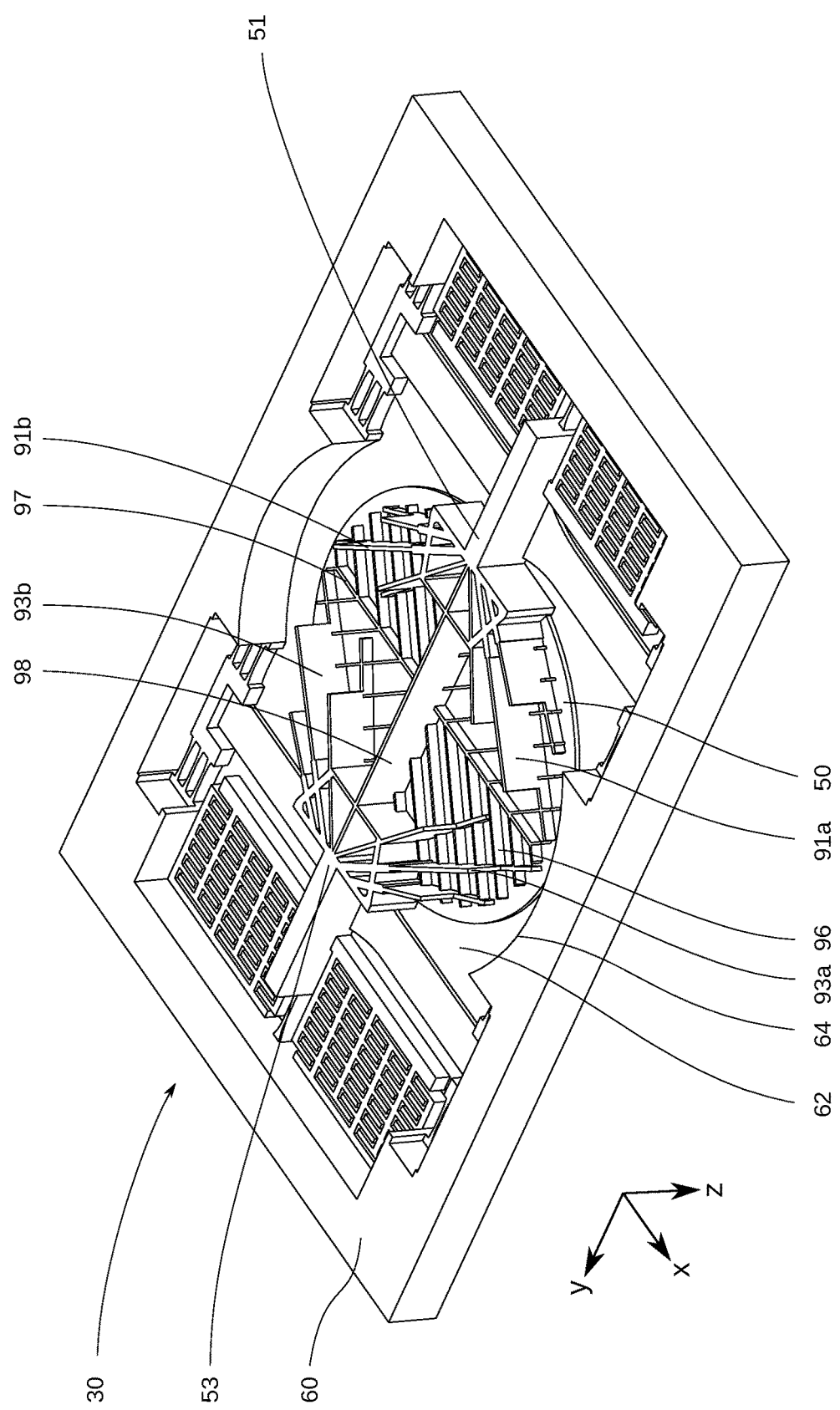
Figure 5E:
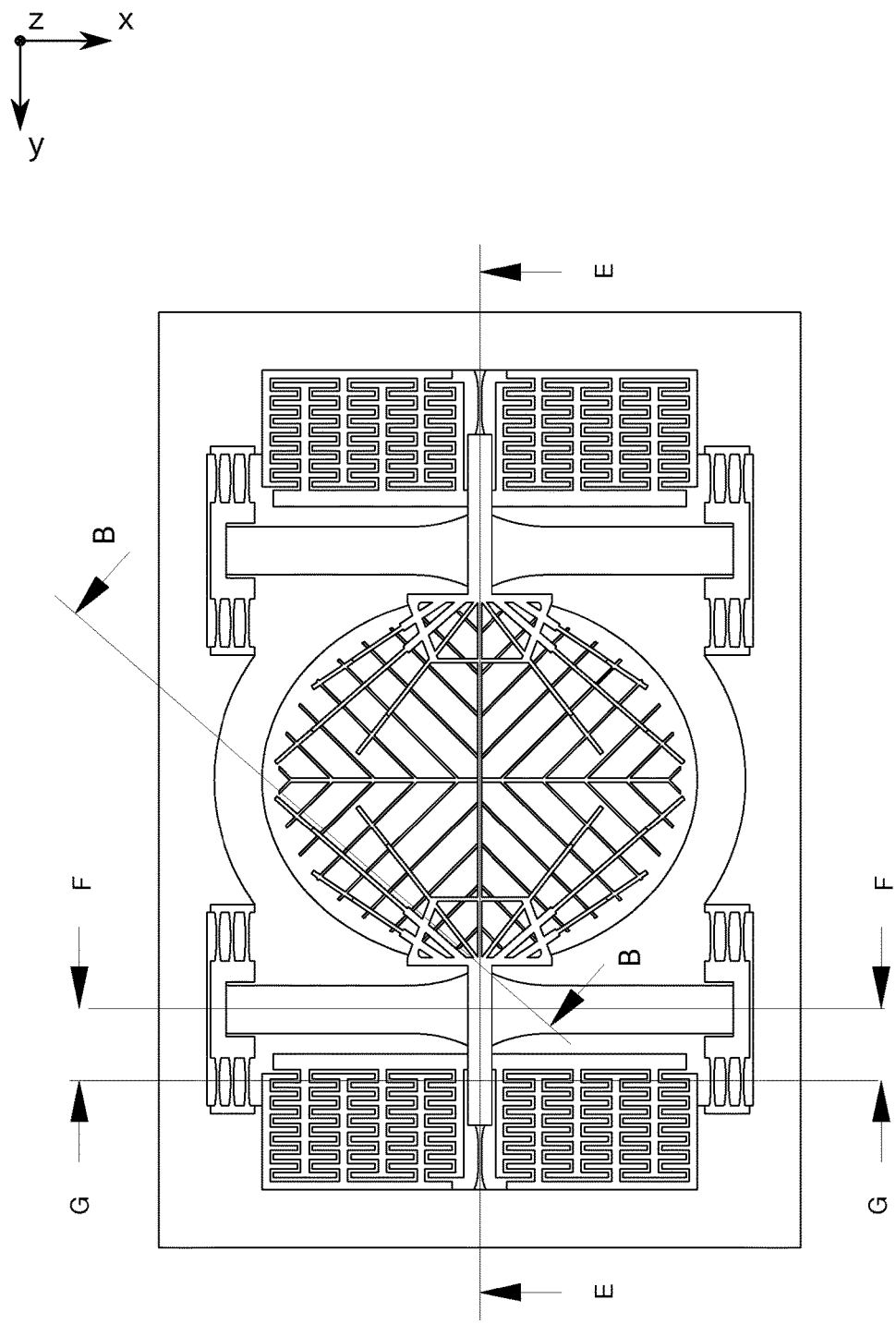
Figure 5F:
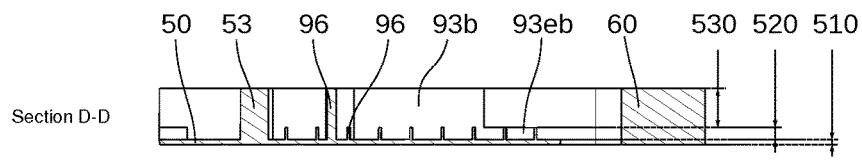
Figure 5G:
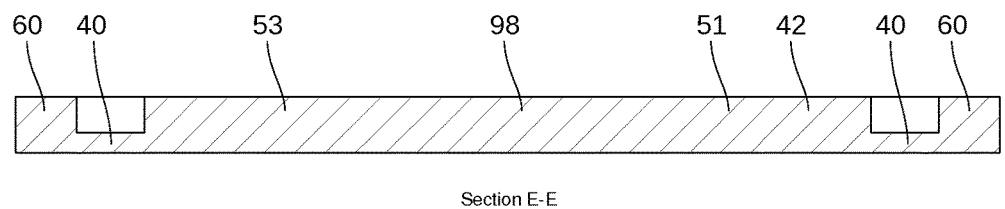
Figure 5H:
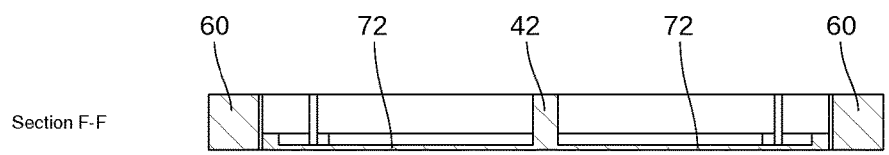
Figure 5I:
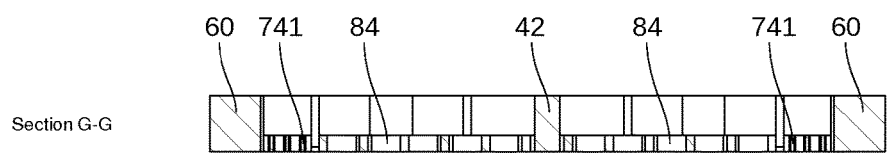

As can best be observed in FIG. 5F, the secondary reinforcement beams 96 have a relatively small height (in Z-direction) as compared to the maximum height of the primary reinforcement beams 91a, 91b, 93a, 93b. This allows for a relatively thin mirror body, rendering possible a further reduction of the moment of inertia while maintaining a rigid overall construction, therewith avoiding that the static and dynamic deformation is increased. In general the number of reinforcement beams in the second layer will be larger than the number of reinforcement beams in the first layer (e.g. at least twice at large). In a preferred embodiment, the secondary reinforcement beams 96 in the second layer 520 are oriented at a 45 degrees angle with respect to the rotation axis, which is more-or-less perpendicular to the reinforcement beams in the first layer. This way also the reinforcement beams in the second layer can be aligned with the direction of the highest material stiffness.

An embodiment of the MEMS-micromirror according to the present invention is manufactured from a layered material comprising a first 510, a second 520 and a third 530 construction layer. Therein a first separation layer is sandwiched between the first and the second construction layer and a second separation layer is sandwiched between the second and the third construction layer.

In an embodiment the mirror body 50 is formed by the first construction layer 510 as an integral disc of material. The primary reinforcement beams 91a, 91b, 93a, 93b may be formed as a patterned residue of said second and third construction layer 520, 530 on the second main surface 57 of the mirror body 50 and the secondary reinforcement beams 96 may be formed as a patterned residue of said second construction layer 520 on the second main surface. Accordingly the primary reinforcement beams 91a, 91b, 93a, 93b can have a maximum height determined by the joint thickness of the second and the third construction layer 520, 530. Typically the thickness of the separation layer is negligible. The secondary reinforcement beams 96 have a maximum height determined by the second construction layer 520.

Typically the thickness of the first construction layer 510 is less than the thickness of the second construction layer 520, e.g. at least two times thinner than the second construction layer and the thickness of the second construction layer 520 is less than the thickness of the third construction layer 530, e.g. at least 4 times thinner than the third construction layer. Typically the first construction layer 510 has a thickness in a range of 5 to 20 μm, the second construction layer 520 has a thickness in a range of about 20 to 80 μm and the third construction layer 530 has a thickness in a range of about 40 to 500 μm. By way of example the first, the second and the third construction layer have a thickness of 10, 40 and 300 μm respectively.

In an embodiment the layered material is an SOI, having silicon construction layers and silicon oxide layers as the separation layers. The silicon oxide layers may be used as an etch stopper in the patterning process, and in addition function as an insulating layer in the finished product.

In embodiments additional layers may be present.

A method for manufacturing a MEMS micromirror may comprise the following steps.

providing a Silicon on Insulator product having a first, a second and a third silicon layer 510, 520, 530 as well as a first siliconoxide layer sandwiched between the first and the second silicon layer and a second siliconoxide layer sandwiched between the second and the third silicon layer, wherein the first silicon layer is thinner than the second silicon layer and the second silicon layer is thinner than the third silicon layer;

applying a first patterning process, wherein the first silicon layer 510 is patterned, applying a second patterning process, wherein the second silicon layer 520 is patterned, applying a third patterning process, wherein the third silicon layer 530 is patterned, wherein the mirror frame 60 is formed in at least the third layer 530, wherein the mirror body 50 is formed in the first silicon layer 510, and wherein said reinforcement beams 91*a*, 91*b*, 93*a*, 93*b* are formed in the second and the third silicon layer 520, 530.

As indicated above, the MEMS scanning micromirror 30 can also include actuator 80 to provide torque to drive the mirror body 50 about the rotation axis 58. In one embodiment, e.g. shown in FIG. 5A, the actuator 80 includes mirror combs 82 interleaved with frame combs 84. In the embodiment of FIG. 5A the mirror combs 82 are mechanically coupled to mirror body 50 by a rigid part 42 of coaxial support beam 40. The frame combs 84 are attached to the mirror frame 60. Applying a difference in electrical potential between an interleaved mirror comb 82 and mirror frame comb 84 creates a driving force between the mirror combs 82 and the frame combs 84, which creates a torque on the mirror body 50 about the rotation axis 58. An oscillating electrical potential can be applied to drive the MEMS scanning micromirror 30 at its natural frequency. Other exemplary actuation methods include electromagnetic actuation and piezoelectric actuators. In electromagnetic actuation, the micromirror is "immersed" in a magnetic field and an alternating electric current through the conductive paths creates the required oscillating torque around the rotation axis 58. Piezoelectric actuators can be integrated in the cantilever beams or the cantilever beams can be made of piezoelectric material to produce alternating beam bending forces in response to an electrical signal and generate the required oscillation torque.

Figure 6A:
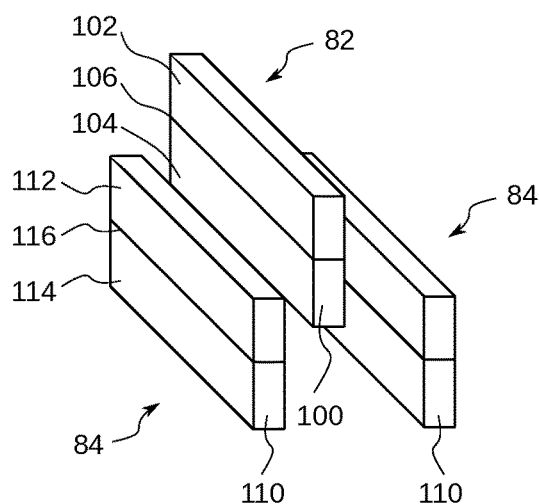
FIG. 6A is a detailed perspective view of comb fingers for a MEMS scanning micromirror in accordance with the present invention.

As indicated above, the MEMS scanning micromirror 30 can be manufactured from single crystal silicon or polysilicon material using photolithography and DRIE techniques. FIG. 6A, in which like elements share like reference numbers with FIG. 3A, is a detailed perspective view of comb fingers for a MEMS scanning micromirror in accordance with the present invention. The comb fingers 100 of the mirror comb 82 are interleaved with the comb fingers 110 of the frame comb 84. In one embodiment, the MEMS scanning micromirror can be manufactured from a silicon-on-insulator (SOI) wafer having an upper silicon layer and a lower silicon layer, with an insulating layer between the upper silicon layer and the lower silicon layer. In one embodiment, the mirror comb 82 and the frame comb 84 can be fabricated so that the insulating layer divides the combs parallel to the mirror surface, producing electrically isolated upper electrical portions and lower electrical portions in each of the comb fingers. The comb fingers 100 of the mirror comb 82 include first electrical portions 102 and second electrical portions 104 separated by insulating layer 106. The comb fingers 110 of the frame comb 84 include first electrical portions 112 and second electrical portions 114 separated by insulating layer 116. Applying a difference in electrical potential between the upper electrical portions in the mirror comb 82 and the lower electrical portions in the frame comb 84, or vice versa, can be used to generate an initial driving force between the mirror combs 82 and the frame combs 84 when the mirror combs 82 and the frame combs 84 are aligned and the mirror body 50 is at rest. The separation of the comb fingers in two (top and bottom) parts allows, by switching between opposed layers, to apply the driving potential (and eventually torque, depending on the comb fingers geometry) for duration greater than half oscillation period per oscillation cycle. In one embodiment, the cantilever beams can be fabricated in the upper silicon layer of the silicon on insulator wafer and can bring the electrical potential to the top first electrical portions 102 of the mirror combs 82. In another embodiment, the cantilever beams can be fabricated in the lower silicon layer of the silicon on insulator wafer and can bring the electrical potential to the bottom second electrical portions 104 of the mirror combs 82. In another embodiment, the coaxial support beams can be fabricated in the lower silicon layer of the silicon on insulator wafer and can bring the electrical potential to the bottom second electrical portions 104 of the mirror combs 82. In another embodiment, the coaxial support beams can be fabricated in the upper silicon layer of the silicon on insulator wafer and can bring the electrical potential to the top first electrical portions 102 of the mirror combs 82. In yet another embodiment, the coaxial support beams can be fabricated in both the lower silicon layer of the silicon on insulator wafer and in the upper silicon layer of the silicon on insulator wafer, and can bring the electrical potential to both the bottom second electrical portions 104 of the mirror combs 82 and to the top first electrical portions 102 of the mirror combs 82.

Figure 6B:
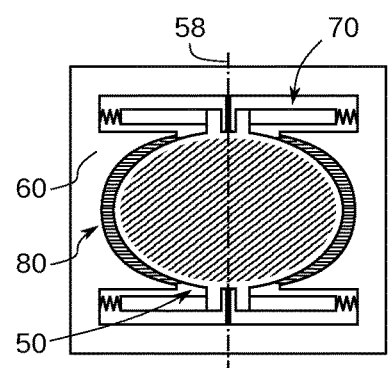
FIGS. 6B, 6C, 6D illustrate different embodiments of a MEMS scanning micromirror of the present invention, each with the actuator at a different location.
Figure 6C:
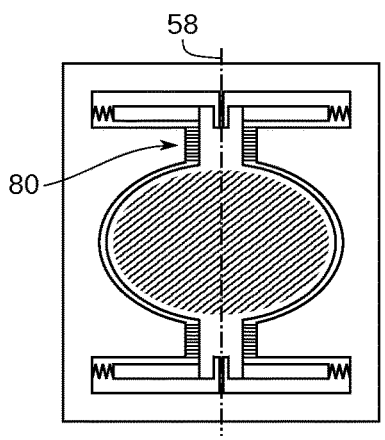
Figure 6D:
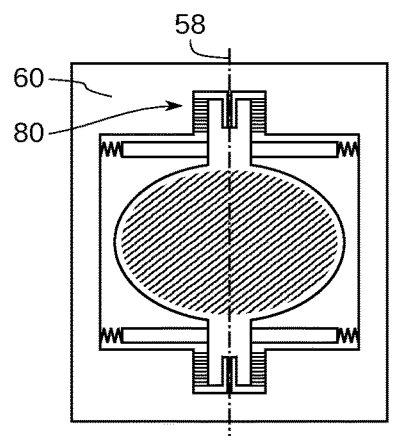

FIGS. 6B-6D show different embodiments of the present invention, each with a different location of the actuator 80. In FIG. 6B the actuator 80 is curved and located at the circumference of the mirror body 50. In FIG. 6C the actuator 80 is located at each side of the mirror body 50, close to the rotation axis 58, and in between the mirror body and the cantilever beam assemblies. In FIG. 6D the actuator 80 is located at each side of the mirror body 50, close to the rotation axis 58, but in between the cantilever beam assemblies and the mirror frame.

FIG. 7A to 14A shows in a perspective view various designs according to the present invention and designs not according to the present invention. FIG. 7B to 14B shows for each of these designs a dynamic deformation of the mirror surface according to a simulation.

Figure 12A:
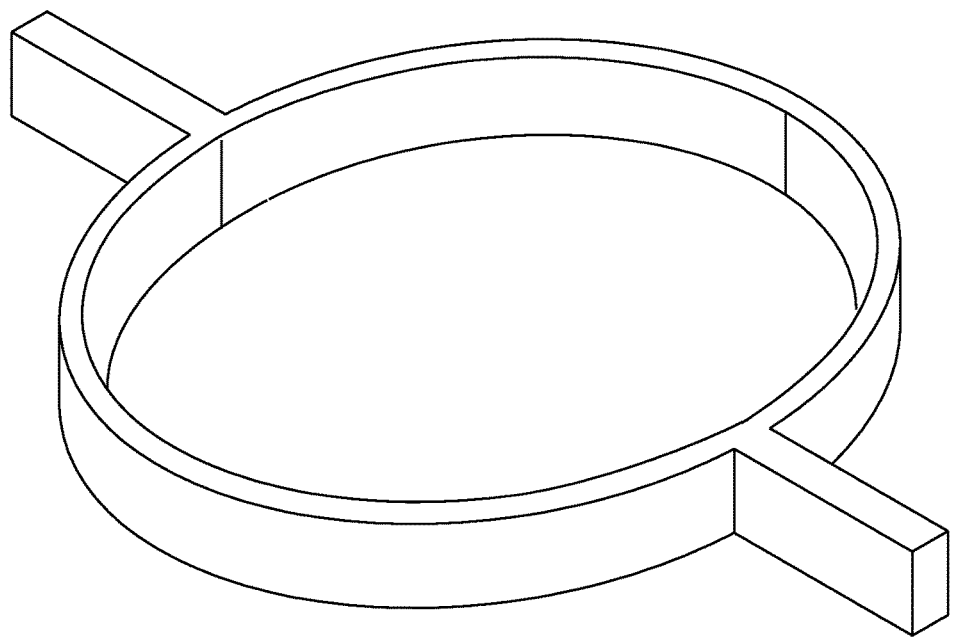
FIGS. 12A, 13A, 14A show in a perspective view respective examples of a MEMS-scanning mirrors not according to the present invention, FIGS. 12B, 13B, 14B respectively show the dynamic deformation for each of these examples as determined from a simulated operation.
Figure 13A:
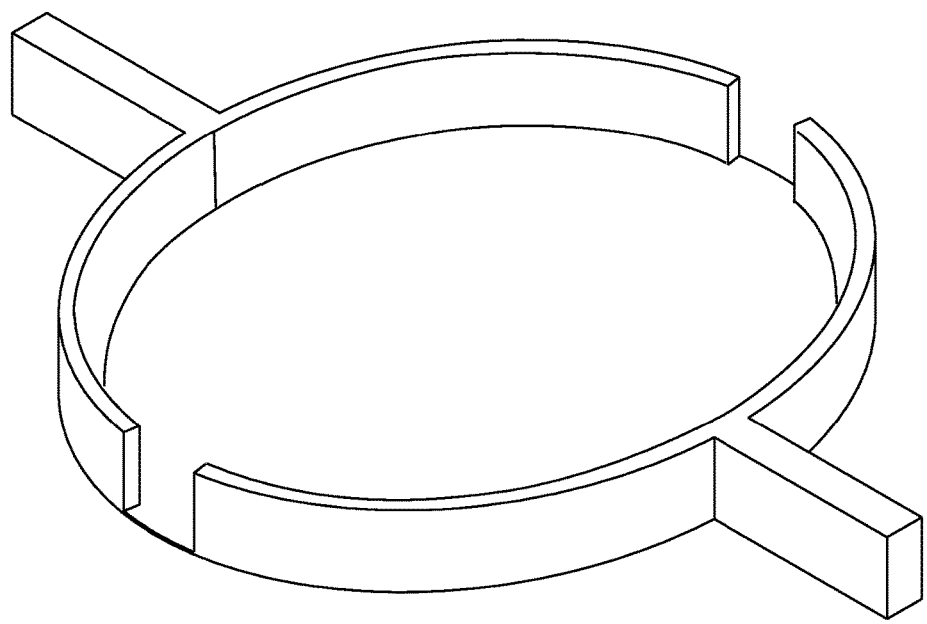
Figure 13B:
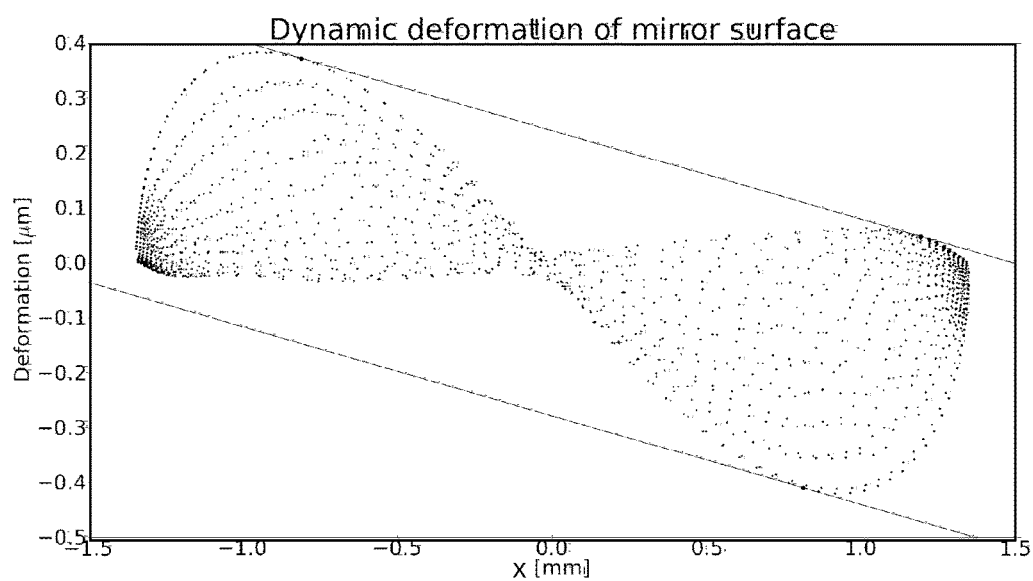
Figure 14A:
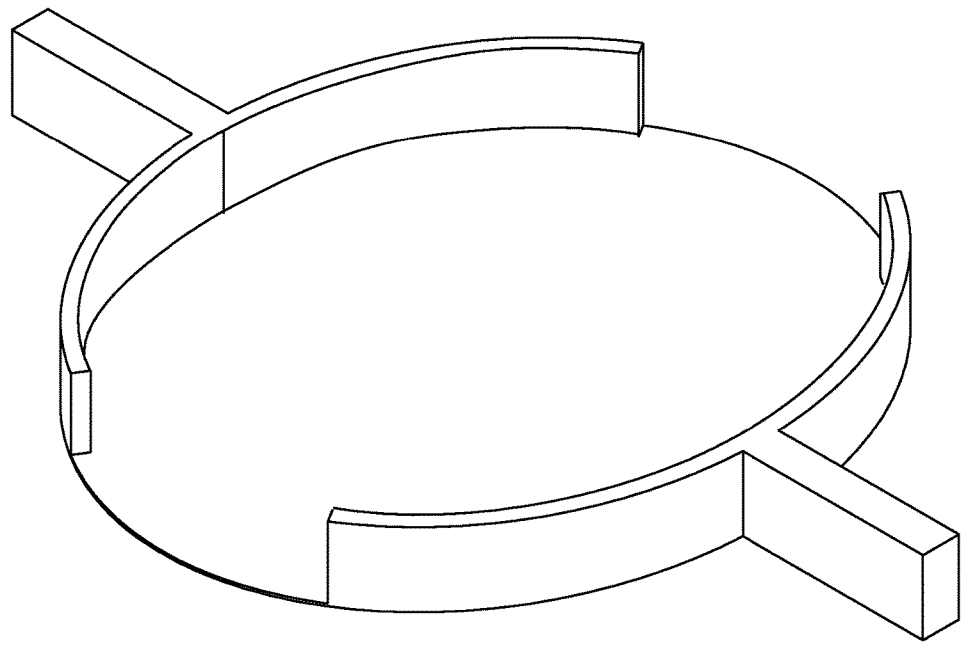
Figure 14B:
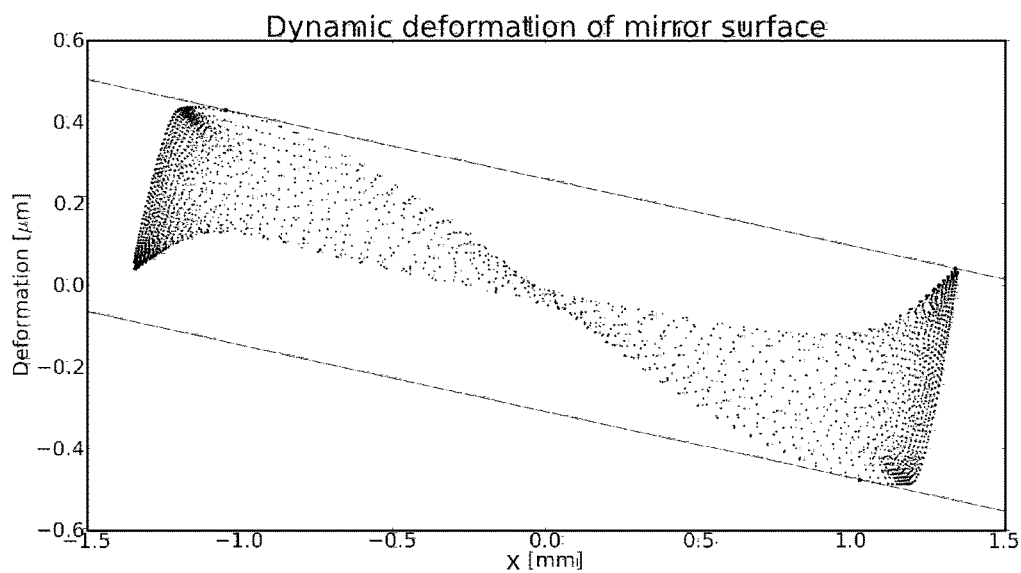

FIGS. 7A, 8A and 9A, 10A and 11A respectively show a first series A1-A2 and a second series B1-B3 according to the present invention. FIG. 12A, 13A, 14A shows a series C1-C3 not according to the invention. In all cases the mirror body was modelled as an ellipse having a thickness of 10 μm and having an in plane size of 2.7×2.3 mm, with its longest axis transverse to its rotation axis. Furthermore, the reinforcement beams in the model have a height (transverse to the plane of the mirror) of 250 μm and a width of 60 μm. A simulation was carried out to determine the dynamic deformation of the mirror surface, presuming a scanning of the mirror in the range of −20 to +20 degrees at an oscillation frequency of 3.3 kHz. Features of the designs A1-A2, B1-B3 and C1-C3 as well as results obtained from the simulation are summarized in the table below. Therein the second column with header R indicates whether (Y/N) the reinforcement structure leaves free an outer rim of the mirror body. The third column with header C indicates whether (Y/N) a reinforcement beam is provided along the central axis. The fourth column with header F indicates whether (Y/N) a reinforcement frame for interconnecting the reinforcement beams. The fifth column with header NB indicates the number of reinforcement beams extending from the end-portions of the mirror. The sixth column with header D indicates whether (Y/N) all reinforcement beams extending from one end-portion of the mirror are disjunct from reinforcement beams extending from the other opposing end-portion. The seventh column with header I indicates in g.μm² the calculated moment of inertia of the mirror. The seventh column with header δ indicates in nm the dynamic deformation of the mirror. The eighth column with header I*δ indicates in g.μm².nm the product of the moment of inertia and the dynamic deformation.

Figure 12B:
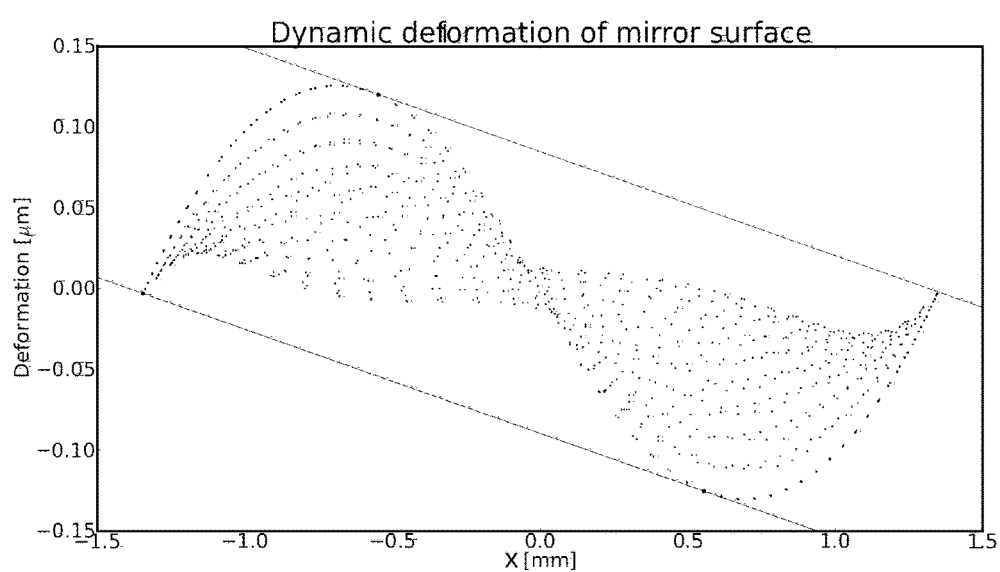

FIG. 12A shows a first design C1 not according to the present invention wherein the reinforcement beams together form a circle around the rim of the mirror. FIG. 12B shows the deformation pattern resulting from the deformation as a function of the distance x to the rotation axis and for a series of points along the direction of the rotation axis. As shown in the table below, the moment of inertia is 338 g.μm² and the deformation is 174 nm. The product of the moment of inertia and the deformation has a value of 58812 g.μm².nm.

For MEMS mirrors it is desirable that the deformation is as low as possible, but preferably less than about one tenth of the wavelength of the light reflected by the mirror. Also the moment of inertia is preferably as low as possible in order to enable a high frequent scanning movement of the mirror. Accordingly, also the product of the moment of inertia and the deformation should be low.

FIGS. 13A, and 14A shows attempts to lower this product by providing the reinforcement beams at the rim of the mirror separate from each other, with a relatively small gap as shown in FIG. 13A and a relatively wide gap as shown in FIG. 14A respectively. Although this lowers the moment of inertia it causes a dramatic increase in the dynamic deformation δ as well as an increase in the product I*δ.

According to the present invention various embodiments according to a first series A1-A2 and B1-B3 are provided in FIG. 7A-8A and FIG. 9A-11A respectively. These embodiments are characterized in that the reinforcement beams leave free an outer rim of the mirror body. In the table it can be seen that in each of these embodiments according to the present invention a substantial reduction is obtained of the product of moment of inertia and deformation as compared to the embodiment C1 that is best in this respect.

Figure 7A:
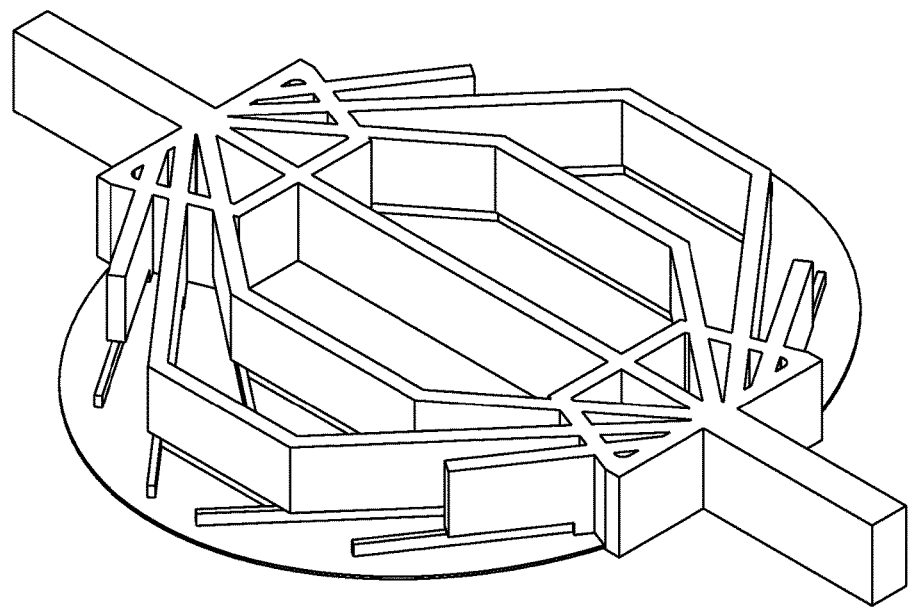
FIGS. 7A, 8A, 9A, 10A, 11A show in a perspective view respective examples of a MEMS-scanning mirror according to the present invention, FIGS. 7B, 8B, 9B, 10B, 11B, respectively show the dynamic deformation for each of these examples as determined from a simulated operation.
Figure 7B:
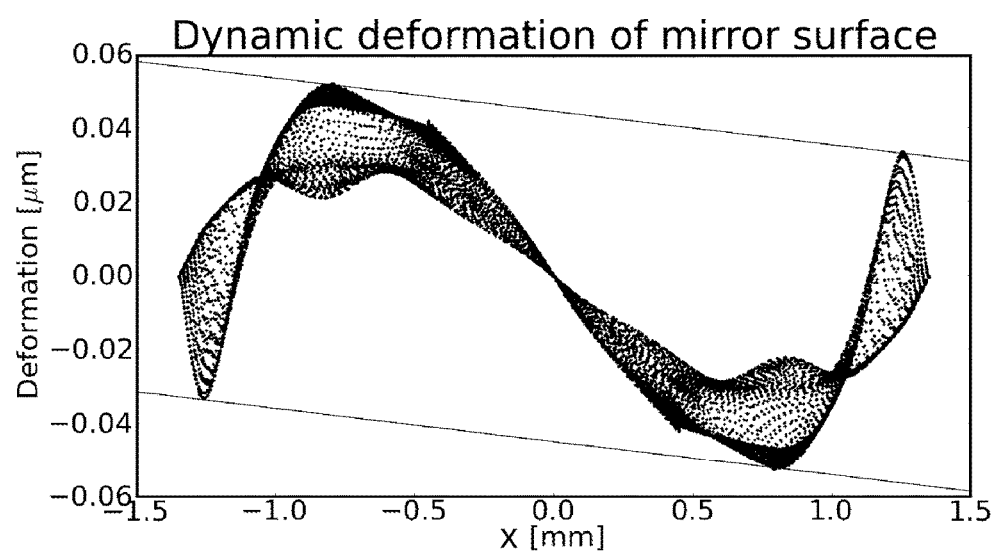
Figure 8A:
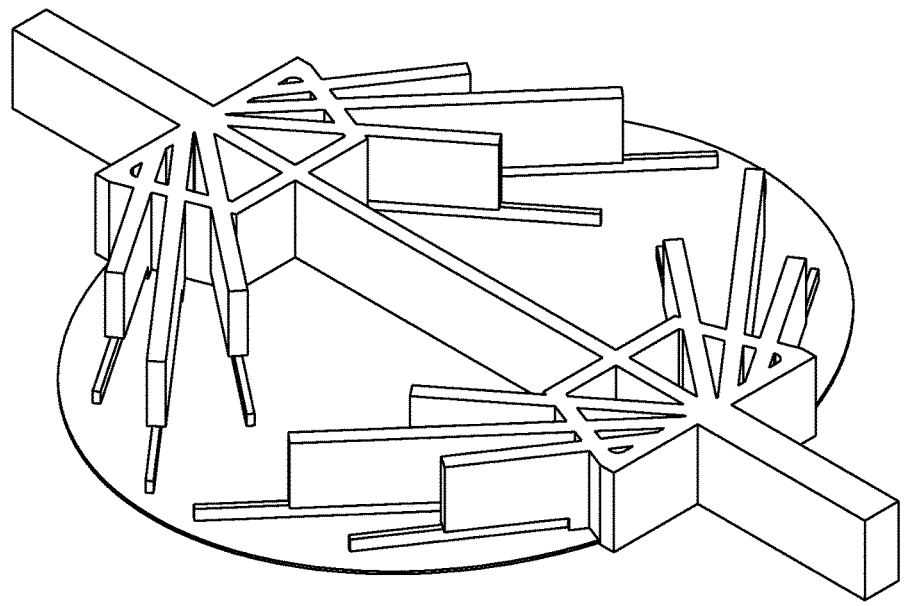
Figure 8B:
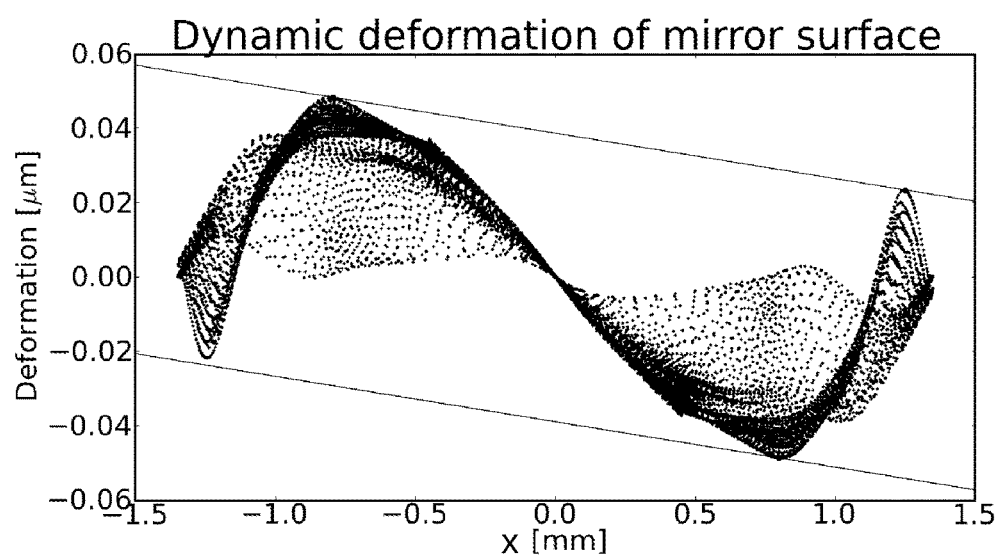
Figure 9A:
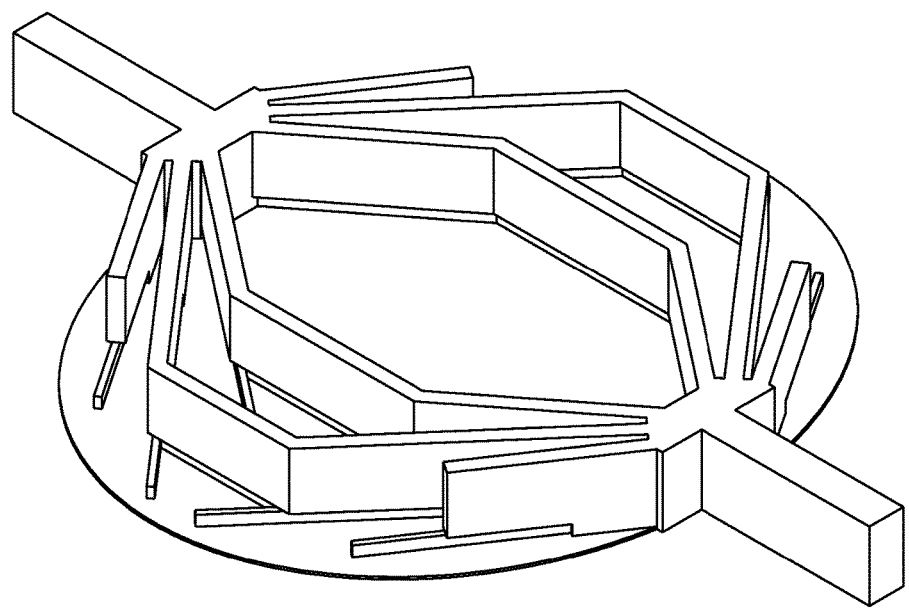
Figure 9B:
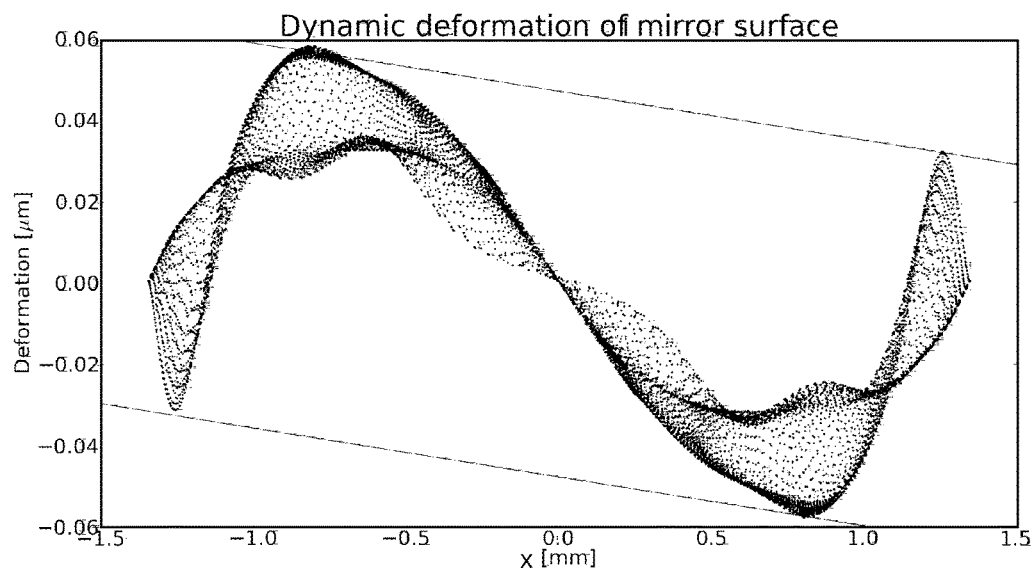
Figure 10A:
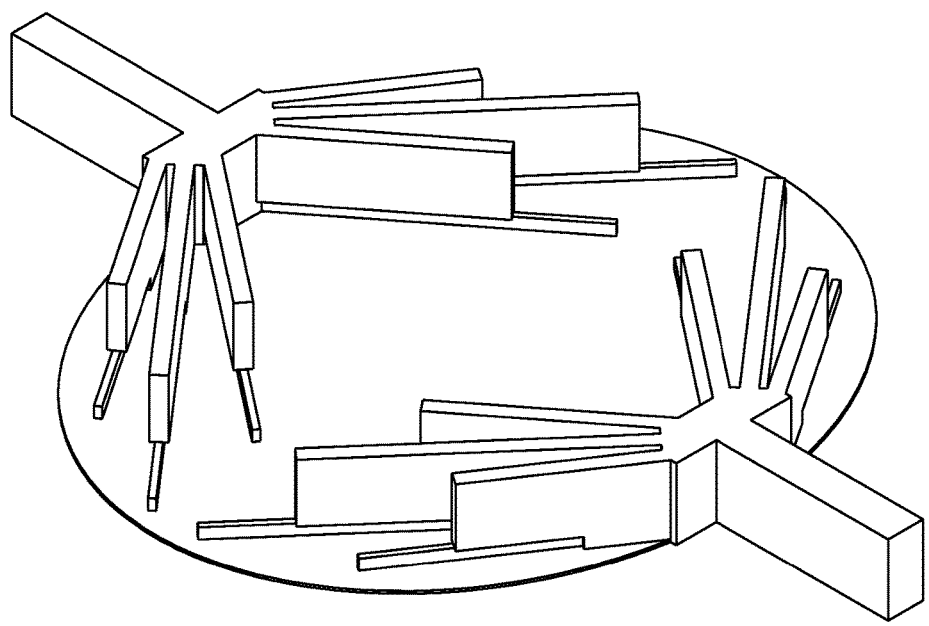
Figure 10B:
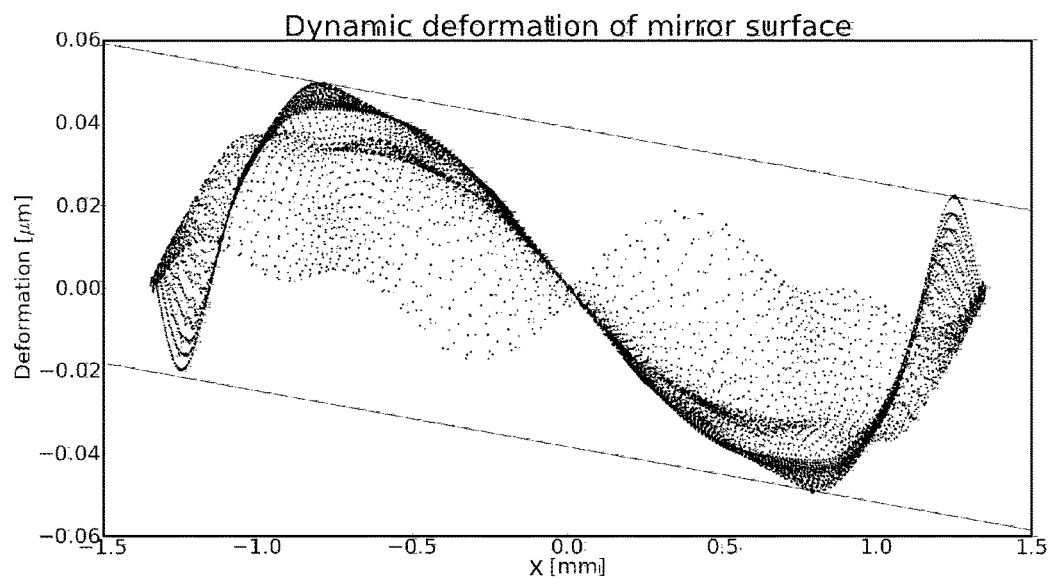
Figure 11A:
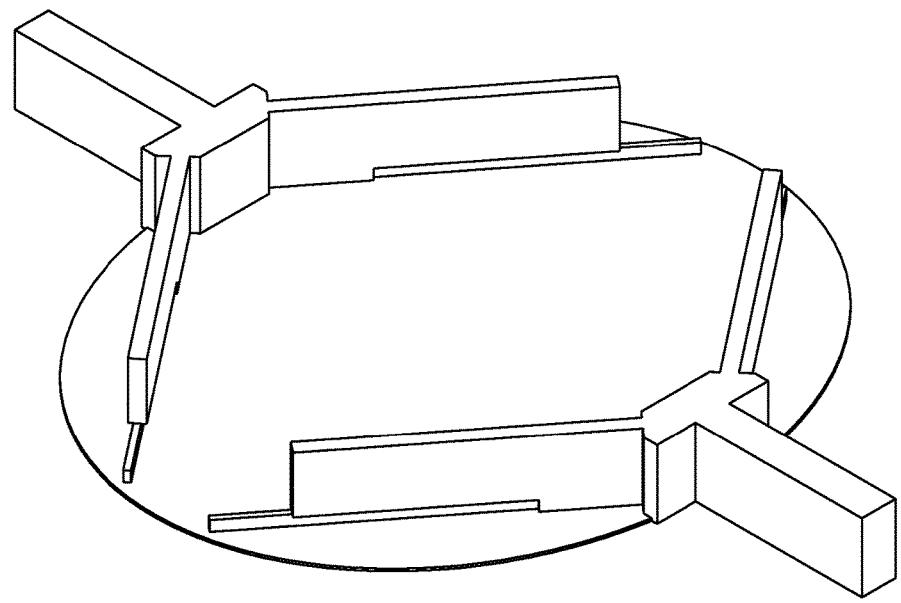
Figure 11B:
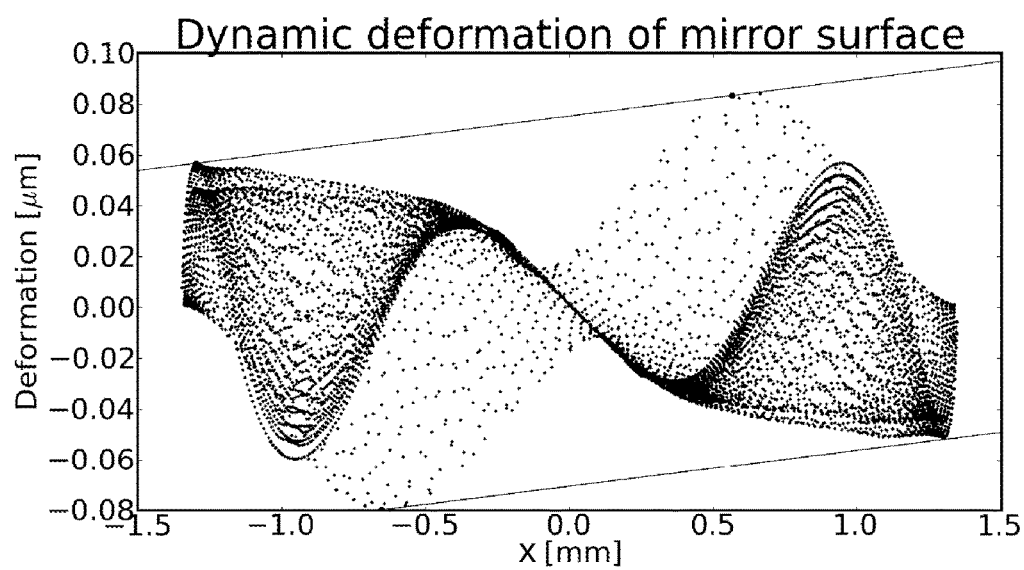

In the series according to the present invention, wherein the reinforcement beams leave free an outer rim of the mirror body mutually disjunct arrangement of the reinforcement beams provides for a further reduction of the dynamic deformation, as appears from a comparison between the examples A1, A2 of FIGS. 7A and 8A as well as from a comparison between the examples B1, B2 of FIGS. 9A and 10A. This is in sharp contrast to the series C1-C3, not according to the invention, wherein the reinforcement beams are arranged at the rim of the mirror.

It was further observed that the presence of additional reinforcement beams as shown in the examples A1-A2 and B1-B2 is favourable. These additional reinforcement beams, also extending from an end-portion, and having the reinforcement beams arranged between them provide for a substantial reduction in dynamic deformation, as can best be seen from a comparison of the embodiments of B2 (FIG. 10A, with additional reinforcement beams) and B3 (FIG. 11A without additional reinforcement beams). The reduction in dynamic deformation is so strong that it outweighs the increase in the moment of inertia in the product of these terms.

TABLE

Overview of various designs.

| Design | R | C | F | NB | D | I (g · μm²) | δ (nm) | I*δ (g · μm² · nm) |
|---|---|---|---|---|---|---|---|---|
| A1 | Y | Y | Y | 12 | N | 291 | 89 | 26044 |
| A2 | Y | Y | Y | 12 | Y | 227 | 78 | 17637 |
| B1 | Y | N | N | 12 | N | 275 | 95 | 26042 |
| B2 | Y | N | N | 12 | Y | 205 | 77 | 15846 |
| B3 | Y | N | N | 4 | Y | 152 | 146 | 22192 |
| C1 | N | N | N | 4 | N | 338 | 174 | 58812 |
| C2 | N | N | N | 4 | Y | 294 | 519 | 152586 |
| C3 | N | N | N | 4 | Y | 188 | 568 | 106784 |

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A MEMS-micro-mirror comprising a mirror body that is rotatably arranged in a mirror frame around a rotation axis extending in a plane defined by the mirror body, wherein the rotation axis extends through a first and a second mutually opposite end-portion of the mirror body, the mirror body having a reflective first main surface and, opposite said reflective first main surface, a second main surface provided with a first pair of reinforcement beams extending from the first end-portion in mutually opposite directions pointing away from the rotation axis and a second pair of reinforcement beams extending from the second end-portion in mutually opposite directions pointing away from the rotation axis, said first and second pairs of reinforcement beams being formed on said second main surface and rising above said second main surface in a direction away from said reflective first main surface, reinforcement beams of said first pair extending from the first end-portion towards respective ones of said second pair, wherein the reinforcement beams leave free an outer rim of the mirror body, and wherein the reinforcement beams of said first pair have ends pointing away from the rotation axis that are disjunct from those of said second pair.

2. The MEMS-micro-mirror of claim 1, further comprising additional reinforcement beams formed on said second main surface and rising above said second main surface in a direction away from said reflective first main surface, said additional reinforcement beams extending from an end-portion, each reinforcement beam being arranged between additional reinforcement beams that extend in mutually opposite directions away from said reinforcement beam.

3. The MEMS-micro-mirror of claim 1, wherein a layer of material forming the reinforcement beams has a direction of lowest material stiffness aligned with the rotation axis.

4. The MEMS-micro-mirror of claim 1, further comprising a respective reinforcement frame at each end portion, the reinforcement frames interconnecting reinforcement beams of the first pair of beams and of the second pair of beams respectively.

5. The MEMS-micro-mirror of claim 4, wherein each reinforcement frame is connected to each of its associated reinforcement beams at at least two distinct locations.

6. The MEMS-micro-mirror of claim 1, wherein the mirror body is rotatably suspended in said mirror frame by a respective coaxial support beam at each end-portion.

7. The MEMS-micro-mirror of claim 1, constructed of a multi-layer material comprising a first, a second and a third construction layer, the second construction layer being sandwiched between the first and the third construction layer, the mirror body being formed by the first construction layer, and the reinforcement beams being formed in the second and the third construction layer.

8. The MEMS-micro-mirror of claim 7, wherein the first construction layer has a thickness less than that of the second construction layer.

9. The MEMS-micro-mirror of claim 7, wherein the second construction layer has a thickness less than that of the third construction layer.

10. The MEMS-micro-mirror of claim 7, wherein further reinforcement beams are formed on said second main surface, said further reinforcement beams rising above said second main surface in a direction away from said reflective first main surface, said further reinforcement beams branching from or crossing the reinforcement beams from the end-portions, the further reinforcement beams being formed in the second construction layer and the reinforcement beams extending from an end-portion being formed in the second construction layer and the third construction layer.

11. The MEMS-micro-mirror of claim 10, wherein said further reinforcement beams are oriented at an angle in the range of 45 to 135 degrees with respect to the reinforcement beams from which they branch or which they cross.

12. The MEMS-micro-mirror of claim 1, being rotatably suspended by a respective coaxial support beam at each end-portion, at least one of the coaxial support beams having a rigid longitudinal portion that mechanically couples the corresponding end-portion to a respective pair of cantilever beams that extend in mutually opposite directions in a direction transverse to the rotation axis towards the mirror frame.

13. The MEMS-micro-mirror of claim 1, being rotatably suspended by a respective coaxial support beam at each end-portion, at least one of the coaxial support beams having a rigid longitudinal portion that mechanically couples the corresponding end-portion to an actuator.

14. The MEMS-micro-mirror of claim 1, wherein the reinforcement beams extending from the end-portions have a height that decreases in a direction towards a periphery of the mirror body.

15. The MEMS-micro-mirror of claim 1, wherein the reinforcement beams extending from the end-portions have a width that decreases in a direction towards a periphery of the mirror body.

16. A method of manufacturing a MEMS-micro-mirror that comprises a mirror body that is rotatably arranged in a mirror frame around a rotation axis extending in a plane defined by the mirror body, wherein the rotation axis extends through a first and a second mutually opposite end-portion of the mirror body, the mirror having a reflective first main surface and opposite said reflective first main surface a second main surface provided with a first pair of reinforcement beams extending from the first end-portion away from the rotation axis, in mutually opposite directions, said first pair of reinforcement beams being formed on said second main surface and rising above said second main surface in a direction away from said reflective first main surface, the method comprising:
  providing a Silicon on Insulator product having a first, a second and a third silicon layer as well as a first silicon oxide layer sandwiched between the first and the second silicon layer and a second silicon oxide layer sandwiched between the second and the third silicon layer, wherein the first silicon layer is thinner than the second silicon layer and the second silicon layer is thinner than the third silicon layer;
  applying a first patterning process, wherein the first silicon layer is patterned;
  applying a second patterning process, wherein the second silicon layer is patterned; and
  applying a third patterning process, wherein the third silicon layer is patterned,
  wherein the mirror frame is formed in at least the third layer, wherein the mirror body is formed in the first silicon layer, and wherein said reinforcement beams are formed in the second and the third silicon layer, and
  wherein the reinforcement beams leave free an outer rim of the mirror body, and
  wherein the reinforcement beams of said first pair have ends pointing away from the rotation axis that are disjunct from those of said second pair.

17. A MEMS-micro-mirror comprising a mirror body that is rotatably arranged in a mirror frame around a rotation axis extending in a plane defined by the mirror body, the mirror body comprising:
  a first end-portion;
  a second end-portion opposite said first end-portion, wherein the rotation axis extends through said first and second end-portions;
  a middle portion between said first and second end portions;
  a reflective first main surface;
  a second main surface opposite said reflective first main surface;
  a first pair of reinforcement beams formed on said second main surface, each reinforcement beam of said first pair of reinforcement beams extending from a start point at said first end-portion to an end point at said middle portion, said end point at said middle portion being a greater distance from said rotation axis than said start point at said end portion; and
  a second pair of reinforcement beams formed on said second main surface, each reinforcement beam of said second pair of reinforcement beams extending from a start point at said second end-portion to an end point at said middle portion, said end point at said middle portion being a greater distance from said rotation axis than said start point at said end portion, wherein the end points of said reinforcement beams leave free an outer rim of the mirror body, and wherein the reinforcement beams of said first pair have ends pointing away from the rotation axis that are disjunct from those of said second pair.

* * * * *

UNITED STATES PATENT AND TRADEMARK OFFICE
CERTIFICATE OF CORRECTION

PATENT NO. : 9,910,269 B2
APPLICATION NO. : 14/361472
DATED : March 6, 2018
INVENTOR(S) : Hendrikus Wilhelmus Leonardus Antonius Maria Van Lierop et al.

Page 1 of 1

It is certified that error appears in the above-identified patent and that said Letters Patent is hereby corrected as shown below:

On the Title Page

ASSIGNEE:
Now reads: "ELMOS SEMICONDUCTOR ARTIENGESELLSCHAFT, Dortmund (DE)";
Should read: -- INNOLUCE B.V., Nijmegen, (NL) --

Signed and Sealed this
Fifth Day of June, 2018

Andrei Iancu
*Director of the United States Patent and Trademark Office*